United States Patent
Gazit et al.

(10) Patent No.: US 9,367,645 B1
(45) Date of Patent: Jun. 14, 2016

(54) NETWORK DEVICE ARCHITECTURE TO SUPPORT ALGORITHMIC CONTENT ADDRESSABLE MEMORY (CAM) PROCESSING

(71) Applicant: Marvell International Ltd., Hamilton (BM)

(72) Inventors: Hillel Gazit, Palo Alto, CA (US); Sohail Syed, San Jose, CA (US); Gevorg Torjyan, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 388 days.

(21) Appl. No.: 14/049,781

(22) Filed: Oct. 9, 2013

Related U.S. Application Data

(60) Provisional application No. 61/714,853, filed on Oct. 17, 2012.

(51) Int. Cl.
*G06F 3/06* (2006.01)
*G06F 17/30* (2006.01)
*G11C 7/10* (2006.01)
*G06F 13/38* (2006.01)

(52) U.S. Cl.
CPC ........ *G06F 17/30982* (2013.01); *G11C 7/1072* (2013.01)

(58) Field of Classification Search
None
See application file for complete search history.

(56) References Cited

U.S. PATENT DOCUMENTS

| | | |
|---|---|---|
| 6,141,743 A | 10/2000 | Strongin |
| 6,553,453 B1 | 4/2003 | Gibson |
| 6,760,880 B1 | 7/2004 | Ofek |
| 6,775,167 B1 | 8/2004 | Avramescu |
| 6,789,116 B1 * | 9/2004 | Sarkissian ........... H04L 12/2602 370/235 |
| 6,792,502 B1 | 9/2004 | Pandya |
| 7,245,623 B1 | 7/2007 | Cheriton |
| 7,440,460 B2 | 10/2008 | Wybenga |
| 7,852,850 B2 | 12/2010 | Kopelman et al. |
| 7,859,877 B2 | 12/2010 | Mondaeev |
| 7,924,628 B2 | 4/2011 | Danon |
| 7,978,700 B2 | 7/2011 | Kopelman et al. |
| RE43,359 E | 5/2012 | Avramescu |
| 8,719,917 B1 | 5/2014 | Ammundi |

(Continued)

FOREIGN PATENT DOCUMENTS

WO WO2006046237 A3 8/2006

OTHER PUBLICATIONS

Agrawal, Banit et al., "Modeling TCAM Power for Next Generation Network Devices", *In Proceedings of IEEE International Symposium on Performance Analysis of Systems and Software (ISPASS-2006)*, pp. 1-10.

(Continued)

*Primary Examiner* — Scott Sun

(57) ABSTRACT

The present disclosure describes systems and techniques relating to processing of network communications. According to an aspect of the described systems and techniques, a network device includes a content addressable memory (CAM) device including random access memory (RAM) devices; and a register configured to store a value for the RAM devices of the CAM device; wherein the CAM device is configured to retrieve data stored in the RAM devices of the CAM device, at a received address offset by the value stored in the register, for comparison to at least a portion of a search string received from a network processor to handle network packet processing.

20 Claims, 14 Drawing Sheets

(56) References Cited

U.S. PATENT DOCUMENTS

| | | |
|---|---|---|
| 2004/0003170 A1 | 1/2004 | Gibson |
| 2008/0263269 A1 | 10/2008 | Kadosh |
| 2009/0043956 A1 | 2/2009 | Ford |
| 2009/0207946 A1 | 8/2009 | Sebeni |
| 2012/0137060 A1 | 5/2012 | Akerib |

OTHER PUBLICATIONS

Arsovski, Igor et al., "A Ternary Content-Addressable Memory (TCAM) Based on 4T Static Storage and Including a Current-Race Sensing Scheme", *IEEE* Journal of Solid-State Circuits, vol. 38, No. 1, Jan. 2003, pp. 155-158.

Content-addressable memory, *Wikipedia, the free encyclopedia*, http://en.wikipedia.org/wiki/ Content-addressable memory, downloaded Aug. 28, 2013, pp. 1-4.

$I^2C$, *Wikipedia, the free encyclopedia*, http://en.wikipedia.org/wiki/ $I^2C$, downloaded Sep. 11, 2013, pp. 1-15.

IPv6, *Wikipedia, the free encyclopedia*, http://en.wikipedia.org/wiki/ IPv6, downloaded Sep. 10, 2013, pp. 1-15.

Joint Test Action Group, *Wikipedia, the free encyclopedia*, http://en.wikipedia.org/wiki/JTAG, downloaded Sep. 11, 2013, pp. 1-15.

Longest prefix match, *Wikipedia, the free encyclopedia*, http://en.wikipedia.org/wiki/ Longest prefix match, downloaded Aug. 28, 2013, one page.

SerDes, *Wikipedia, the free encyclopedia*, http://en.wikipedia.org/wiki/SerDes, downloaded Sep. 11, 2013, pp. 1-4.

Shannon, C.E., "A Mathematical Theory of Communication", Reprinted with corrections from *The Bell System Technical Journal*, vol. 27, pp. 379-423, 623-656, Jul., Oct. 1948, 55 pages.

Shannon's source coding theorem, *Wikipedia, the free encyclopedia*, http://en.wikipedia.org/wiki/Shannon's source coding theorem, downloaded Sep. 3, 2013, pp. 1-5.

Bai et al, "Automatic and Efficient Heap Data Management for Limited Local Memory Multicore Architectures", Compiler and Microarchitecture Laboratory, Arizona State University, 2013, 6 pages.

Corporaal, "Automatic Heapmanagement and Realtime Performance", Delft University of Technology, Faculty of Electrical Engineering, 1991, 6 pages.

U.S. Appl. No. 14/049,712, Office Action mailed Jun. 5, 2015, 12 pages.

U.S. Appl. No. 14/049,696, Office Action mailed Jun. 25, 2015, 16 pages.

\* cited by examiner

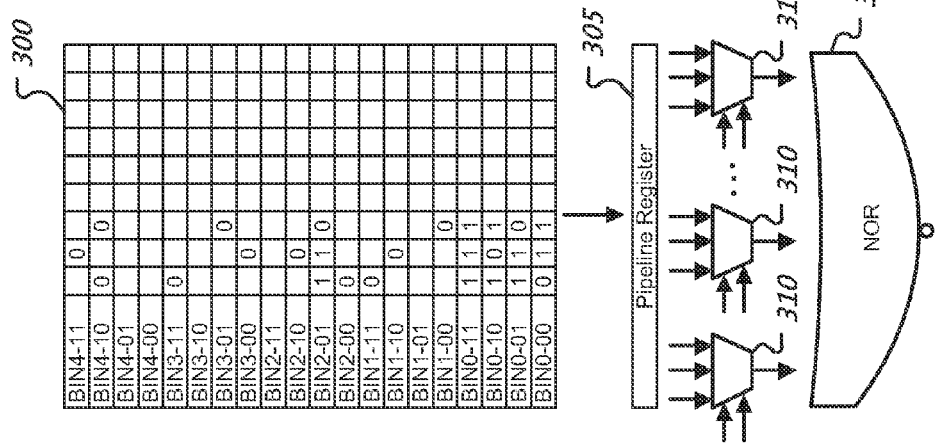

NETWORK DEVICE ARCHITECTURE TO SUPPORT ALGORITHMIC CONTENT ADDRESSABLE MEMORY (CAM) PROCESSING

CROSS REFERENCE TO RELATED APPLICATIONS

This application claims the benefit of the priority under 35 U.S.C. §119(e) from U.S. Provisional Application Ser. No. 61/714,853, filed Oct. 17, 2012 and entitled "COMPRESSION SCHEME 4:3 FOR TCAM ENGINES", this application is related to U.S. patent application Ser. No. 14/049,665 entitled "APPARATUS AND METHODS TO COMPRESS DATA IN A NETWORK DEVICE AND PERFORM TERNARY CONTENT ADDRESSABLE MEMORY (TCAM) PROCESSING". U.S. patent application Ser. No. 14/049,696 entitled "APPARATUS AND METHODS TO STORE DATA IN A NETWORK DEVICE AND PERFORM LONGEST PREFIX MATCH (LPM) PROCESSING", and U.S. patent application Ser. No. 14/049,712 entitled "APPARATUS AND METHODS TO COMPRESS DATA IN A NETWORK DEVICE AND PERFORM CONTENT ADDRESSABLE MEMORY (CAM) PROCESSING", each of the above applications were filed on the same day as this application and are hereby incorporated by reference.

BACKGROUND

The present disclosure describes systems and techniques relating to processing of network communications.

Communication networks typically send information in discrete sections often referred to as packets, which can be fixed or variable in length. In addition, in the course of processing packets using layered communication protocols, packets are often encapsulated within header and trailer data to form new packets. As packets travel through a computer network, routing and forwarding of the packets is performed by network devices within the network, and the details of such routing and forwarding operations often depend on differing amounts of data found in different portions of the packets.

SUMMARY

The present disclosure describes systems and techniques relating to processing of network communications. According to an aspect of the described systems and techniques, a network device includes: a content addressable memory (CAM) device including random access memory (RAM) devices; and a register configured to store a value for the RAM devices of the CAM device; wherein the CAM device is configured to retrieve data stored in the RAM devices of the CAM device, at a received address offset by the value stored in the register, for comparison to at least a portion of a search string received from a network processor to handle network packet processing.

The CAM device can include multiple memory modules, wherein each of the multiple memory modules can include multiple RAM devices having multiple associated registers configured to define boundaries of multiple virtual modules within each of the multiple memory modules; and the network device can include a virtual memory module manager configured to define multiple tables of different bit widths and different record depths within the multiple memory modules. The CAM device can include an algorithmic ternary CAM (TCAM) formed using the multiple memory modules, and the CAM device can include a cell based TCAM. In addition, a ratio between a size of the algorithmic TCAM and a size of the cell based TCAM can be selected to increase an overall fill rate.

The virtual memory module manager can be configured to turn off one or more memory modules that are not needed based on a current set of table definitions. The network device can include a spare memory module for use in re-hashing of the multiple memory modules. The network device can include a hardware accelerator configured to facilitate updates to the multiple memory modules during online operation, after an initial loading of rules during boot up of the network device. The network device can include a search buffer.

The network device can include a serializer/deserializer (SERDES) interface. The register can include four or more registers configured to store four or more values to define boundaries of four or more virtual modules that span the RAM devices in the CAM device. The CAM device can include a ternary CAM (TCAM) device.

According to another aspect of the described systems and techniques, a method includes: receiving, in a content addressable memory (CAM) device, an address to access random access memory (RAM) devices of the CAM device; offsetting the address by a value stored in a register associated with the RAM devices of the CAM device; and retrieving data stored in the RAM devices of the CAM device at the offset address for comparison to at least a portion of a search string received from a network processor to handle network packet processing.

Receiving the address can include receiving the address from a hash RAM, and offsetting the address can include offsetting the address by a value stored in a register selected from a set of four or more registers corresponding to four or more virtual modules that span the RAM devices in the CAM device.

The CAM device can include multiple memory modules, wherein each of the multiple memory modules includes multiple RAM devices having multiple associated registers configured to define boundaries of multiple virtual modules within each of the multiple memory modules; and the method can include defining multiple tables of different bit widths and different record depths within the multiple memory modules. The CAM device can include (i) an algorithmic ternary CAM (TCAM) formed using the multiple memory modules, and (ii) a cell based TCAM; and the method can include using the cell based TCAM to store rules that would drop a fill rate or utilization if placed in the algorithmic TCAM.

The method can include turning off one or more memory modules that are not needed based on a current set of table definitions. The method can include: re-hashing a module of the multiple memory modules using a spare memory module; and upon successful re-hashing of the module, activating the spare memory module and deactivating the re-hashed memory module. The method can include using a hardware accelerator to handle updates to the multiple memory modules during online operation, after an initial loading of rules during boot up. The method can include initiating all searches of the CAM device from a search buffer. In addition, the initiating can include initiating a search in response to a same command that loads the search into the search buffer.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiments below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described systems and techniques can potentially result in content addressable memory (CAM) and ternary CAM (TCAM) devices that are readily reconfigurable to handle multiple tables of different sizes. Virtual modules created in the memory modules of a CAM or TCAM can be implemented in hardware such that the software that accesses the CAM or TCAM device can remain oblivious to the details of the virtual module reconfigurations within the device. This reconfigurable architecture can allow near optimal utilization of memory space, and also potentially result in improvements with respect to power consumption. In addition, further flexibility and improved fill rate and/or utilization can be potentially realized by the addition of a cell based TCAM to the architecture. In some implementations, a hardware accelerator is included to improve update speeds. Some implementations can also include latent and spare memory modules to facilitate handling of online updates, such that search operations can continue in parallel with updating a TCAM.

Details of one or more implementations are set forth in the accompanying drawings and the description below. Other features and advantages may be apparent from the description and drawings, and from the claims.

DRAWING DESCRIPTIONS

FIG. 3A shows an example of a memory device structure.

FIG. 3B shows an example of an encoding of value bits to position bits.

FIG. 4A shows an example of data in records to be compressed.

DETAILED DESCRIPTION

Figure 1:
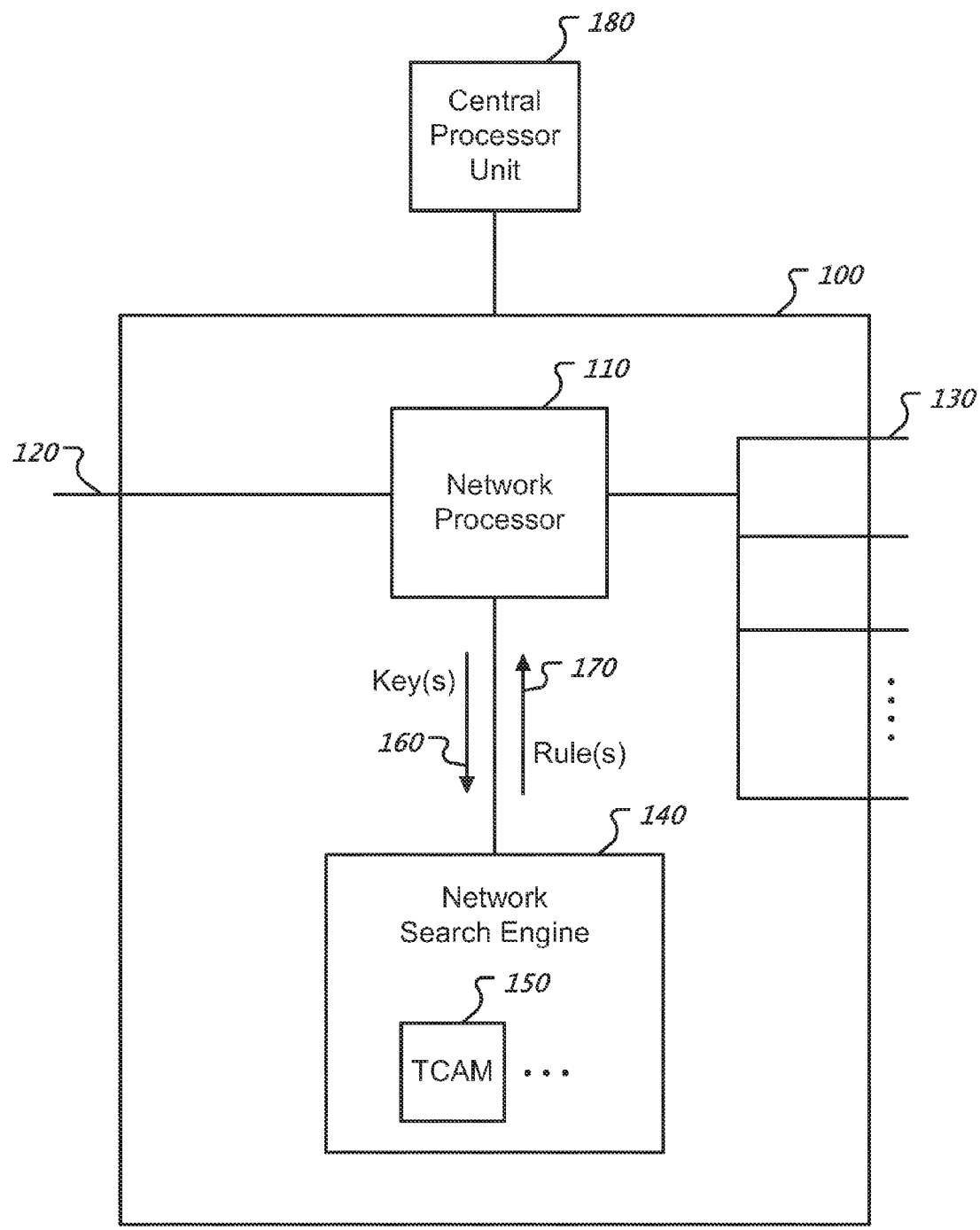
FIG. 1 shows an example of a network device.

FIG. 1 shows an example of a network device 100. The network device 100 can be one or more integrated circuit (IC) devices, a larger device, such as a router or switch, or a combination of these. In some implementations, the network device 100 is coupled with a central processing unit (CPU) 180 of a network communications apparatus. In some implementations, the network device 100 is a network communications apparatus and includes the CPU 180. The network device 100 can be coupled with a computer network, such as a local area network (LAN) or a wide area network (WAN), and processes packet information.

The network device 100 includes a network processor device 110, which receives packets or portions of packets on an input port or interface 120. The network processor 110 can parse incoming packet information to identify relevant fields for handling network operations, such as routing and forwarding. The network processor 110 can be coupled with a network search engine 140, which can assist in determining appropriate actions to take for respective packets. Key information 160 extracted from the packet information, such as network addresses or portions thereof, port numbers, other header and trailer information, or combinations thereof, can be sent to the network search engine 140, which stores rules associated with such key information.

The network search engine 140 can return rules 170 corresponding to the keys 160. The network processor 110 can determine actions to take based on the rules 170 received. Such actions can include outputting a packet on a selected output port or interface 130 or dropping a packet, as appropriate. For additional details regarding network processor operations and structures, see U.S. Pat. No. 7,978,700, which is hereby incorporated by reference.

The network search engine 140 can use one or more memory devices to store rules 170 to be searched, as requested by the network processor 110. The network search engine 140 can include one or more content addressable memories (CAMs) and/or one or more ternary CAMs (TCAMs), e.g., TCAM 150. Moreover, these CAMs, TCAMs or both can be cell based or algorithmic in nature. For additional details regarding algorithmic TCAMs, see U.S. Pat. No. 7,852,850, which is hereby incorporated by reference.

The following description includes details regarding systems and techniques that are employed with an algorithmic TCAM (referred to as a "QTCAM"), but these systems and techniques can be applicable to all Random Access Memory (RAM) based TCAMs where a basic unit (a single bit) can represent one of two states. In general, two real TCAM cells can be replaced by four RAM bits and a selector. The input bits are used to pick bits from the selectors, and a nor gate can later find the result. This approach is often used in place of a real (cell based) TCAM because the number of bits is the same, one selector is about as big as two XOR and two OR, and the final AND is one half the amount of bits.

Figure 2:
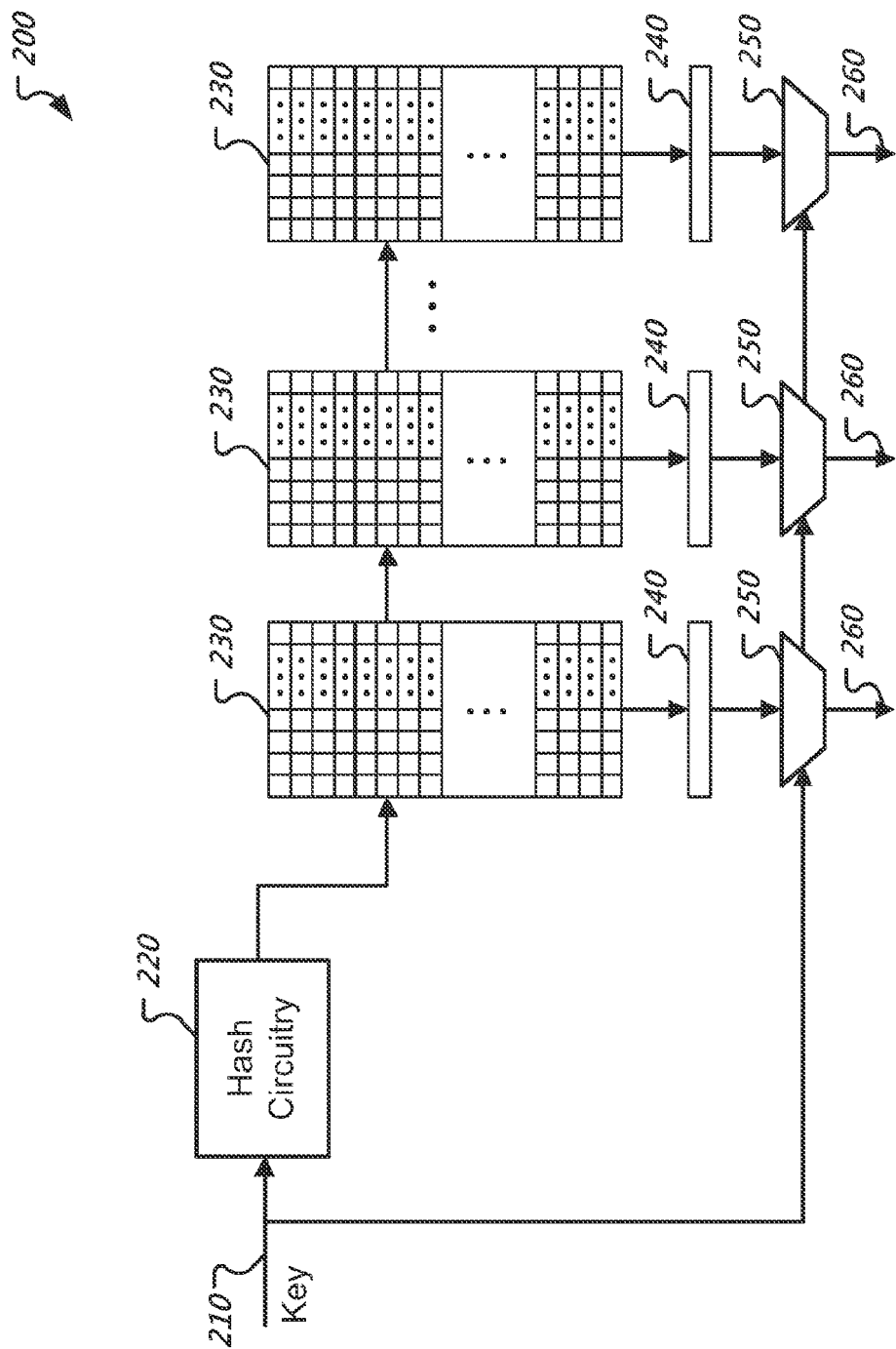
FIG. 2 shows an example of an algorithmic ternary content addressable memory (TCAM).

FIG. 2 shows an example of an algorithmic TCAM (QT-CAM) 200. In some implementations, the QTCAM 200 is included in the network search engine 140 of FIG. 1. The QTCAM 200 includes an input interface 210 on which a search key is received. The search key corresponds to relevant fields identified by a network processor and can include zero (0) bits, one (1) bits, and don't care (X) bits. For example, the search key can include one or more of an internet protocol (IP) address, a socket number, a protocol, a multiprotocol label switching (MPLS) label, or virtual routing and forwarding (VRF) data.

The search key is processed by hash circuitry 220 to generate one or more line identifiers. The hash circuitry 220 can employ known systems and techniques to effect an algorithmic TCAM. For example, the hash circuitry 220 can implement the systems and techniques of U.S. Pat. No. 7,852,850. Moreover, FIG. 2 shows a single line identifier that indicates a location in each of multiple memory devices 230. However, in some implementations, only a single memory device 230 is used, where different memory locations or regions of the memory device 230 can be handled differently. In addition, in some implementations, the hash circuitry 220 can generate different line identifiers for different memory devices 230 or different memory locations or regions within one or more memory devices 230.

The memory devices 230 can include RAM of various types, such Static RAM (SRAM), Dynamic RAM (DRAM), Synchronous DRAM (SDRAM), Flash RAM, etc.

For example, each memory device 230 can be a 512×256 RAM. In addition, each memory device 230 can have an associated buffer 240 and comparator 250, where a memory device 230 and its associated buffer 240 and comparator 250 can be viewed as a memory device module. The circuitry of a memory device 230 provides data indicated by a line identifier to the corresponding buffer, and the circuitry of the corresponding comparator 250 determines whether or not there is a match between the buffered data and the search key. These comparison operations can be performed in parallel, and outputs 260 can indicate whether or not a match was found for the search key in each respective memory device 230.

FIG. 3A shows an example of a memory device structure. In some implementations, the memory device structure of FIG. 3A is implemented for each of multiple memory device modules in the QTCAM of FIG. 2. The memory device structure includes circuitry 300 that stores encoded representation of value bits (0, 1, & X) for use in network packet routing. The encoding of the value bits into position bits (0 & 1) and the storing of these position bits into the circuitry 300 can occur upon boot up of a network device, and can also occur as needed for updates. In some implementations, such encoding of value bits and storing of the position bits is performed by an appropriately programmed CPU 180. In some implementations, such encoding of value bits and storing of the position bits is performed by processing circuitry embedded in the network device.

The storage circuitry 300 can be made incapable of storing position bits representing at least one combination of the value bits. This is done to implement a compression scheme that reduces the amount of storage circuitry 300 needed to store a given number of rules. In general, compression requires efficient coding of bits. The compression scheme employed in some implementations can represent two bits having three possible values (0, 1, & X, i.e., $3^2=9$) in three position bits having two possible values (0 & 1, i.e., $2^3=8$). On its face, this may seem impossible because eight positions cannot represent nine values. However, eliminating different combinations of the value bits from being available for storage in different memory locations (either within a single memory device or across different memory devices) can overcome this problem.

FIG. 3B shows a table 330 with an example of an encoding from value bits to position bits, where there is one combination of value bits (XX) which cannot be represented by a corresponding set of three position bits. In practice, the XX combination is common and useful, and thus would typically not be dropped. In some implementations, the XX combination will never be dropped, and XX is always coded as 111. For example, if 0X is dropped, then the mapping can be:
    value bits of 00 encode to position bits of 000;
    value bits of 01 encode to position bits of 001;
    value bits of 0X will have no encoding value;
    value bits of 10 encode to position bits of 010;
    value bits of 11 encode to position bits of 011;
    value bits of 1X encode to position bits of 100;
    value bits of X0 encode to position bits of 101;
    value bits of X1 encode to position bits of 110; and
    value bits of XX encode to position bits of 111.
In some implementations, hard-coding is used, and the order of the nine possible outputs (00, 01, 0X, 10, 11, 1X, X0, X1, XX) is always maintained.

Thus, an elimination technique can be used to complete position to value representation. For example, if there are eight modules, the elimination technique can avoid using one type of value bits combination with each respective module, e.g., for every pair of bits. Thus, other modules can employ different versions of the general encoding approach, where different value bit combinations are excluded from having a corresponding encoded representation in position bits for different memory device modules. In addition, the elimination can be for different combinations (e.g., different pairs) in the same module. By allocating the excluded bit combinations appropriately among different memory devices, any TCAM entry that has a value bit combination that cannot be represented in one memory device module can readily be placed into another memory device module of the TCAM that can accept that value bit combination using corresponding position bits defined for that other memory device module.

Referring again to FIG. 3A, the circuitry 300 can be a database RAM of 512×256 bits. In an uncompressed case, 1024 bits per RAM represent 256 TCAM entries, i.e., two value bits to four position bits means (total bin size/RAM)/(position bits)=(4*256)/4=256. In the case of compression, 1020 bits per RAM represents 340 values records, i.e., two values bits to three position bits means (total bin size/RAM)/(position bits)=(4*255)/3=340.

During search operations, since each bin has compressed the values therefore, the complete bin should be read, i.e., all 1020 values, into a register 305 (e.g., a pipeline register of size 255 bits, i.e., eighty five records of three bits). Reading 1020 values from four rows (255/3=85 values) would mean a four cycle throughput hit. Thus, the number of inputs to a NOR tree 315 can be 85 instead of 256. Likewise, there can be 85 encoders 310, where each encoder 310 has five inputs: two bits from the search key and three bits from the register 305, which is read from the bin. Three position bits from reading the bin/database memories per record determines the value bits according to the (elimination) encoding for that module, and then the two search bits can be compared in a manner similar to that which would be done in the case of an uncompressed data storage design. Moreover, in some implementations, a number coded in three bits (between 0 and 7) can be read, the number can be translated (based on knowledge regarding the eliminated state) into four bits, and the four bits can be fed into a selector to pick an appropriate output.

Note that in some implementations, the combination of structures shown in FIGS. 2 and 3A can be modified to increase throughput with a likely corresponding increase in power consumption. Further, it should be noted that according to Shannon's source coding theorem, the compression rate is bound by the source entropy. In other words, the better the fixed rate compression is, the smaller the space covered. In general, any compression scheme can fail on data that is close to random noise.

In practical terms, if one tries to compress 16 TCAM bits into 17 binary bits, the probability that a random set of 16 TCAM bits would fit into 17 binary bits is $(2^{17})/(3^{16})=0.003$. The vast majority of random TCAM records would not fit even one field, much less five. As a result TCAM compression for some random noise will likely fail. But note that IP addresses, socket numbers, protocols, MPLS labels, VRF, and some other popular fields do not behave as random noise. Moreover, for this high probability to fail on not "common router records", you also pay in complicated custom hardware, latency and heat. Since router data is not random, e.g., for IP addresses, it is very uncommon to have an MSB as X and a LSB as non-X, the X0 and X1 states are very rare, and so the compression scheme described herein is likely to succeed.

Compression theoretically allows us to put the data in one single wide RAM. But its disadvantages are: 1) fill rate since you need more hash bits and therefore more opportunities to have X in the hash bits; 2) the hash RAM will be about ten times larger (3 more input bits, 2 more output bits) i.e. instead of using 2K×7 we end up using 16K×9; 3) power since, with compression, we read four bits for two TCAM bits rather than one bit per two TCAM bits, and so dynamic power will be about four times larger; 4) wider SRAM macros 64*80=5120 bits wide are not possible therefore segmentation would still be required; 5) more logic is used to uncompress the data before sending it to the NOR tree; 6) the software is more complicated; and 7) verification is more complicated. Advantages of Compression are: 1) it can allow the use one single SRAM; and 2) write/update/delete is faster because we only write to one line instead of four lines.

Referring again to FIG. 2, the number of memory device modules employed in the TCAM (e.g., one, two, four, eight, sixteen, etc.) can vary with implementation, as well as which particular ternary value is excluded for a given module (or portion thereof). In some implementations, the exclusion of ternary values is hard coded into the hardware of the TCAM. In some implementations, the exclusion of ternary values can be determined by a program, and is thus changeable for a given set of hardware. Moreover, in some implementations, the exclusion of ternary values is decided in accordance with statistical analysis of the rules to be stored in the TCAM.

Furthermore, in some implementations, the ternary values that are excluded from representation can be those that include one or more don't care (X) bits. In such cases, if some rules contain a bit pattern that cannot be represented (either because of the original TCAM design or because the TCAM has been filled with rules that fully occupy the memory locations that handle the particular bit pattern) then each such rule can be split apart into separate rules that cover both cases (0 or 1) for each X bit. For example, if the bit pattern 0X in a rule cannot be represented, the rule can be split into two rules, where a first of these rules uses 00 for the 0X pattern and a second of these rules uses 01 for the 0X pattern. Provided such situations of unrepresentable rules are rare, there will be a minimal impact on performance for such rule duplication.

Figure 3C:
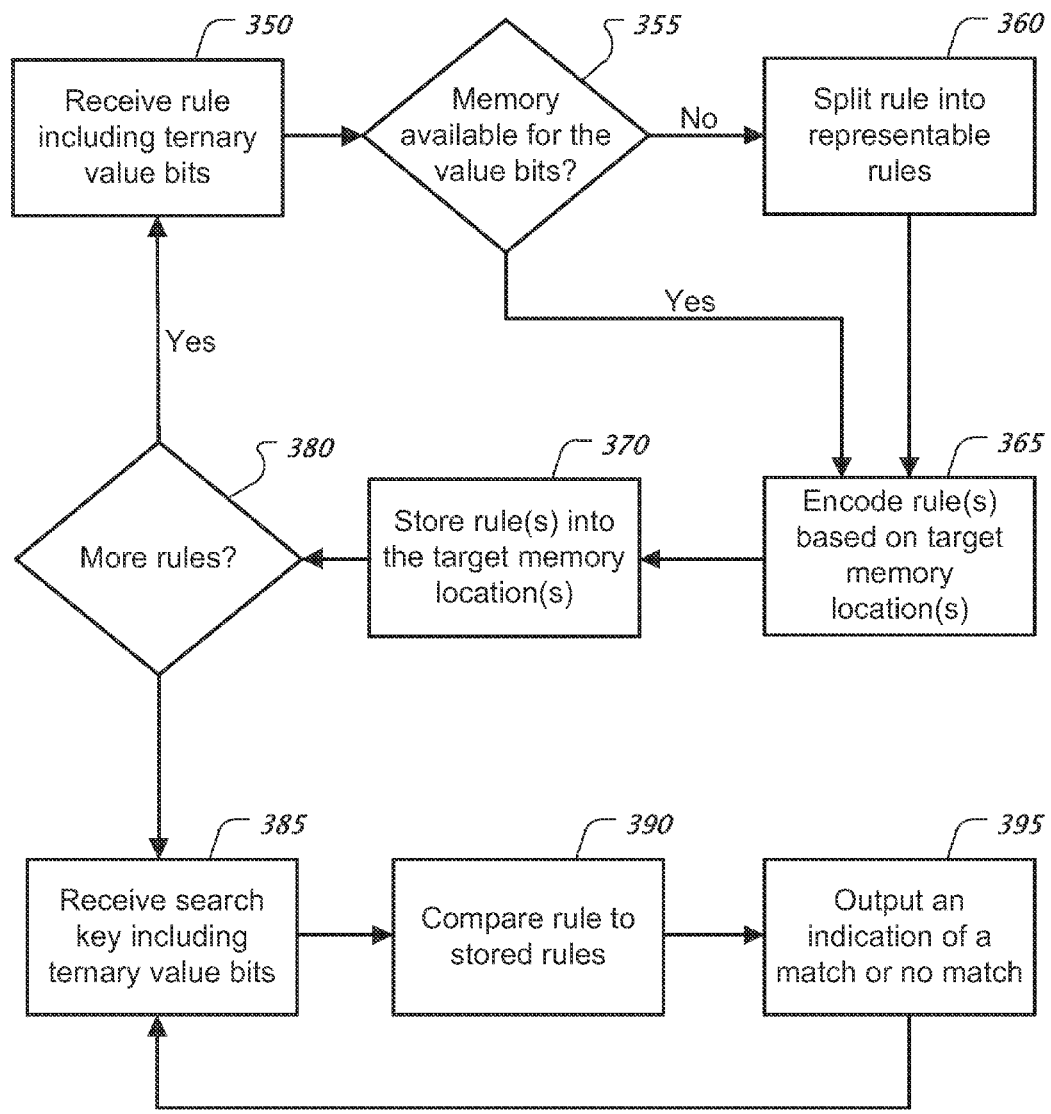
FIG. 3C is a flowchart showing an example of a process of loading and searching an algorithmic (TCAM).

FIG. 3C is a flowchart showing an example of a process of loading and searching an algorithmic TCAM. A rule including ternary bits (0, 1, & X) is received at 350. A check is made at 355 that memory space is available for the rule based on the ternary bits present in the rule. If space is not available, e.g., because the rule includes a bit pattern that corresponds to a memory device that is full, the rule can be split at 360 into two or more rules that can be represented in the memory devices. For example, as discussed above, if the bit pattern 0X in a rule cannot be represented, the rule can be split into two rules, where a first of these rules uses 00 for the 0X pattern and a second of these rules uses 01 for the 0X pattern.

Either the original rule or the two or more rules resulting from the split at 360, can then be encoded at 365 into binary bits (0 & 1) based on one or more target memory locations for the rule(s). For example, one or more target memory locations for a rule can be two or more memory devices, where each of the two or more memory devices is incapable of storing binary bits that represent at least one combination of the ternary bits. Thus, the ternary bits from different portions of a rule can be encoded differently depending upon target memory locations for those different portions of the rule.

The encoded rule(s) can then be stored into the target memory location(s) at 370. Thus, the encoding and storing can involve selection of memory locations based on the ternary bit patterns of the rule as compared with ternary bit patterns that are eliminated as options for the various memory locations. While more rules are still to be encoded at 380, the process continues until the rule database is loaded with the desired rules for use in network packet routing.

Once the rule database is initiated, a search key can be received at 385. The search key can also include ternary bits that are to be compared with the ternary bits of the stored rules. These ternary bits can correspond to one or more of an IP address (source, destination or both), a socket number, a protocol, an MPLS label, or VRF data. The received rule is compared to the stored rules at 390. This can include reading the position bits stored in the two or more memory devices into two or more registers and using multiple encoders, such as described above. Moreover, the comparing can be performed in parallel for data found in multiple (e.g., eight) memory device modules. Depending on the result of the comparing, an output can be provided at 395, where the output indicates a match or no match, before the process repeats for a next rule.

In some implementations, statistical analysis of the rules to be stored in the TCAM can provide another approach to compression. FIG. 4A shows an example 400 of data in records to be compressed. This example is of a twelve bit wide stream with only three records to be stored. Records 1, 2, and 3 have zero and one bits in bit locations numbers 0 to 11. As shown in the example 400, record 1 and record 3 have the same bit values in bit locations 0, 1, 4, 5, 8, and 9. This commonality among the records can be used to reduce the amount of data to be stored.

A sample record 405 shows the commonality between records 1 and 3, with mismatches shown as Y's. In some implementations, the sample record 405 can be stored with don't care (X) bits for the mismatches for use in checking an incoming search key. In some implementations, the don't care bits need not be stored, but can be kept track of algorithmically by only storing and checking the common bits of the records, such as described further below.

If the sample record 405 doesn't match an input key, then none of the records it represents will match that same key, and the remaining uncommon bits need not be checked. If the sample record 405 does match an input key, then the remaining uncommon bits are checked to confirm one or more matches with the compressed records. Thus, the remaining uncommon bits 410 and 415 of the compressed records 1 and 3 are also stored for checking. These remaining uncommon bits 410 and 415 can be grouped to form a twelve bit wide set 420, and the system can keep track of the dividing line between the data of record 1 and record 2. In some implementations, this can be done using a simple greedy algorithm, but other methods can be used.

The unmatched record 2 will also be stored as a twelve bit wide set 425 for checking against the search key in the usual fashion. This example only includes three records for simplicity of description. However, many more than three records are typically stored, and depending on the nature of the data to be stored and checked, the compression savings can be significant. For example, if millions of records are to be stored in a CAM or TCAM, and a substantial number of these records (or sets of these records) include common bit columns, the reduction in storage space needed can readily make up for the overhead used to keep track of the compressed data in the CAM or TCAM.

Figure 4B:
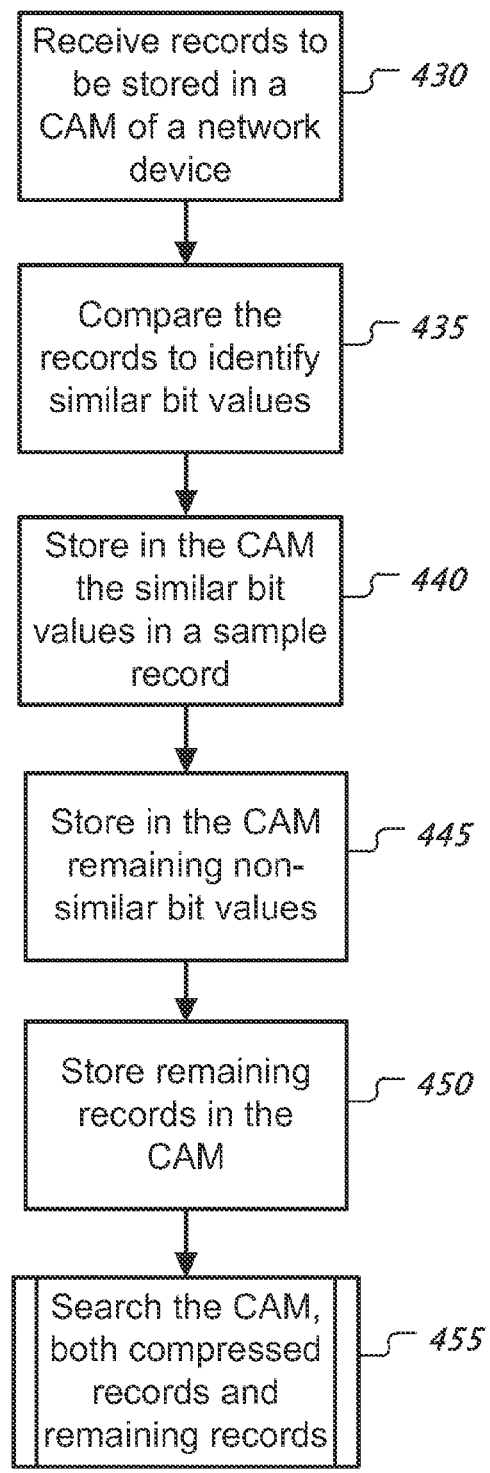
FIG. 4B is a flowchart showing an example of a process of compressing data records in a CAM.

FIG. 4B is a flowchart showing an example of a process of compressing data records in a CAM. The CAM can be a TCAM. In some implementations, the CAM (or TCAM) can be included in a network device, such as described above, and can be used in network packet routing.

At 430, records are received for storing in the CAM. For example, this can occur upon boot up. At 435, the records are compared to identify similar bit values at respective bit positions of at least a portion of the records. This can involve checking for a minimum number of common columns among the records, which can be a proper subset of all the records to be stored in the CAM.

At 440, similar bit values identified in at least some of the compared records are stored in the CAM in a single sample record, which then represents all of those similar records. As noted above, this can involve storing only the common data values, in both CAM and TCAM implementations, or this can involve storing the common data values along with don't care (X) bits in some TCAM implementations. At 445, remaining non-similar bit values of the similar records are stored in the CAM. These non-similar bit values can be concatenated into one or more records for storage within the CAM, and the relation between these non-similar bit values of the similar records and the original can be maintained. Thus, since the similar bit values of the similar records need not be stored repeatedly, the similar records are effectively compressed for storage within the CAM.

At 450, remaining records of the received records that were not similar enough to be compressed for storage are themselves stored in the CAM for use in search operations. At 455, the CAM can be searched based on a received search key. This can involve searching both the uncompressed records and the compressed records.

Note that this process of partitioning the records according to common bits can be understood as having two somewhat contradictory goals: (1) a large number of records, and (2) a large number of common bits. To address this, a variation of simulated annealing can be used, or other algorithms can be used.

Figure 4C:
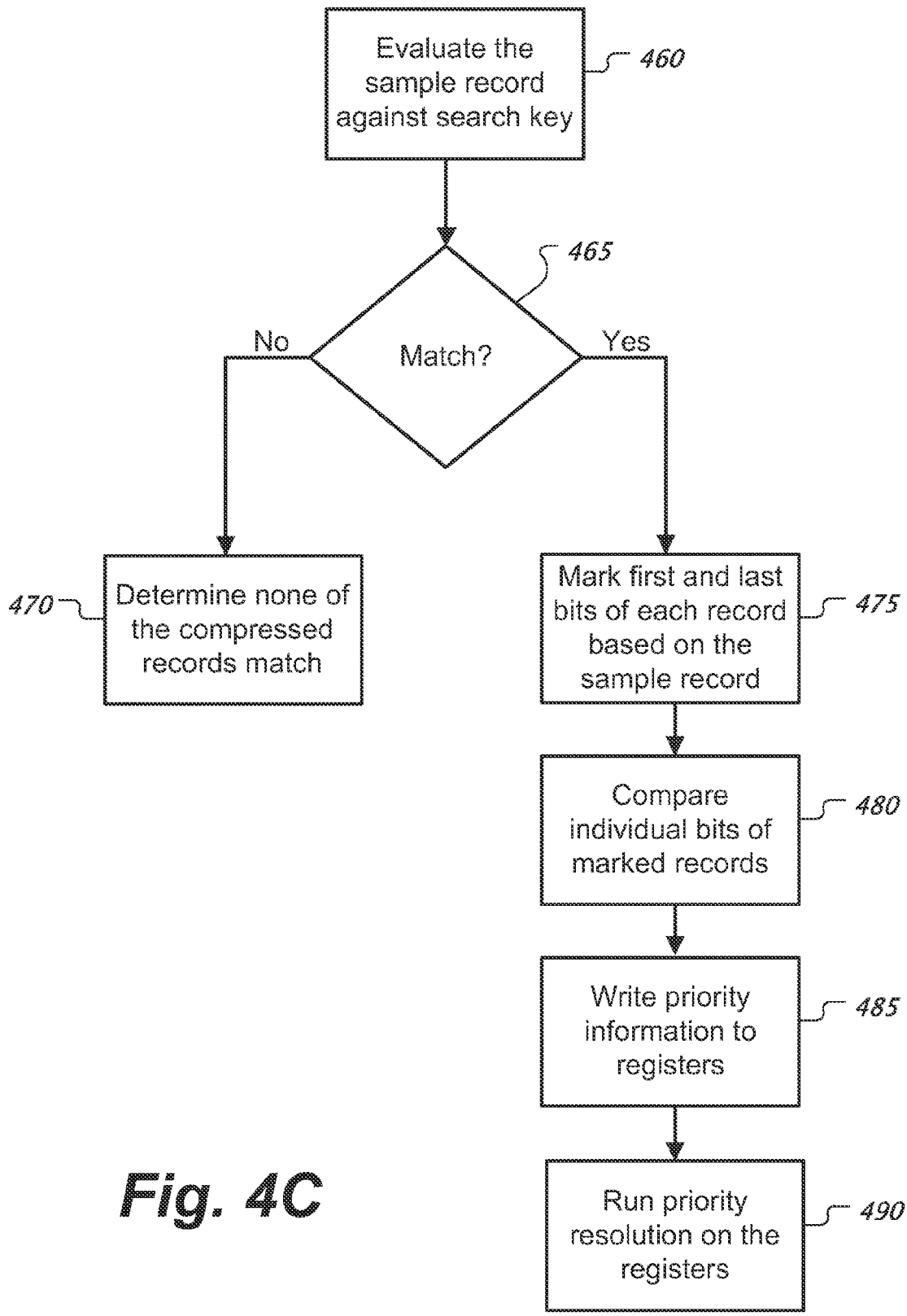
FIG. 4C is a flowchart showing an example of a process of searching compressed data records in a CAM.

FIG. 4C is a flowchart showing an example of a process of searching compressed data records in a CAM. At 460, the single sample record can be evaluated with respect to the received search key. This can be done using a simple (e.g., cell based) TCAM. If there is no match at 465, then it is known that none of the compressed records match the search key. Thus, it is determined that none of the compressed records match the search key at 470. However, if the sample record matches, then the remaining non-similar bit values need to be checked.

At 475, the first and last bits of each record represented by the remaining non-similar bit values can be marked based on the sample record. At 480, individual bits of the remaining non-similar bit values can be compared against the search key using the first and last bits of each record, as marked, to determine which (if any) of the compressed records match the search key. In addition, at 485, a stored priority can be written from the CAM to a register in a set of registers for each of the compressed records that matches each bit from the first bit to the last bit marked for that compressed record. Moreover, at 490, priority resolution can be run on the set of registers for the compressed records and for any uncompressed records that match the search key so that any identified matches are handled in the proper priority order.

As noted above, the CAM can be a TCAM. In addition, the CAM or TCAM can be implemented using the other systems and techniques described throughout this application. Thus, the CAM can be built from multiple memory devices, e.g., multiple 512×256 RAM devices. For example, TCAM implementations can include 36 RAMs with 256 bits ($2^8$), where the total overhead would correspond to the number of compressed bits, plus the number of uncompressed bits, plus the sample record, plus the priority number. The total records can then be 36, the record size can be 256, the bits to be compressed can be 9216, and the overhead without priority can be 272. Thus, the minimum number of compressed records required can be two, so as to meet the 272 bits overhead, and at least 512 bits should be compressed.

In some implementations, the complete bin has to be read during a search operation once the hash selects the bin. During a normal search operation (without compression) only one row per bin need be read, but with compression, all four of the bin rows should be read, in some implementations. However, reading and uncompression can be done in parallel, and uncompression should not take more than one cycle. Thus, in some implementations, a total of a five cycle latency may be added due to use of this compression scheme, provided uncompression hardware is parallelized enough to take only one cycle.

In such implementations, the uncompressed records can be evaluated as before. The sample record can be evaluated taking the 2&3 values (i.e., 10 and 11) as X. If the answer is "no match", then the search of the compressed records is done, and all priority values of the compressed records can be marked as "no match". Otherwise, based on the sample record, (1) the number of value 3 bits can be found, (2) a set of value 3 bits can be generated and sent on physical wires to the compressed records, (3) the first and last bit of every record can be marked based on the number of records and the number of value 3 bits, (4) work can be performed for every compressed record, starting from the first marked bit, by comparing bit j of the record to bit j of the physical wire, and if all the bits for a compressed record match, and the last bit is k, the priority (next bits) can be written to register j/32. Finally, priority resolution can be run on the registers and on the uncompressed records to identify which records match according to their proper priority.

Figure 5A:
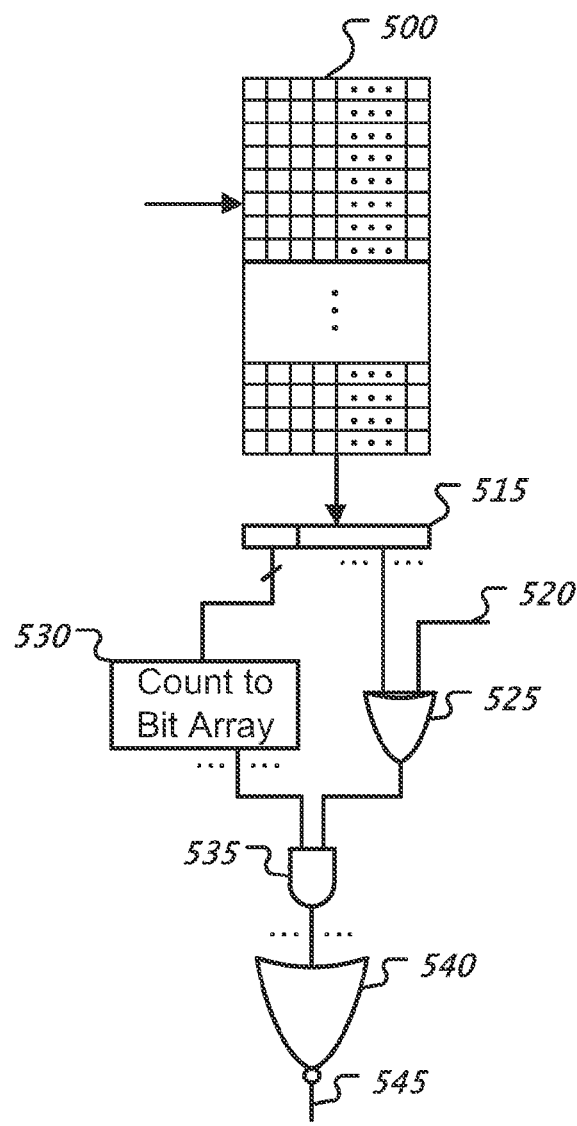
FIG. 5A shows an example of longest prefix match (LPM) and exact match hardware.

The description above includes systems and techniques that are applicable to access control list (ACL) network processing, in comparison to which, longest prefix match (LPM)

and exact match processing is relatively simpler. However, with the advent of Internet Protocol version 6 (IPv6), the complexity of LPM and exact match processing systems increases. FIG. 5A shows an example of LPM and exact match hardware that can readily be applied to IPv6.

The hardware of FIG. 5A can be implemented using the systems and apparatus described elsewhere in this application, but rather than splitting a record among multiple memory devices (e.g., SRAMs), each memory device 500 (e.g., a RAM) can contain a complete record. When an identifier is received (e.g., a line identifier generated by hash circuitry 220 described above in connection with FIG. 2), the circuitry of FIG. 5 can copy data from a location in the RAM 500, which is indicated by the identifier, to a buffer 515. This data can include zero and one bits corresponding to a network address (e.g., a 32 bit network address or a 128 bit network address) and also a count of don't care bits.

Note that in the case of packet forwarding using LPM processing, the don't care bits can be presumed to always be used with the least significant bits of the network address. Thus, multiple bits of the data copied to the buffer 515 can be an encoded number usable to generate a vector mask to identify the don't care bits for the comparison, and only the non-X bits (zeros and ones) of the network address need be stored in the RAM 500 and copied to the buffer 515.

The following examples describe fixed length implementations, where space is used in the RAM 500 for the full length of the network address even though some of the bit positions correspond to don't care bits, but some implementations can store records as variable length records to save space. For example, the fixed length number of don't care bits can be stored for every record, with the variable length data after, and the beginning of the data can be found by partial sums in vectors algorithms, which are well known. In fully fixed length implementations, such extra steps to locate the data need not be performed, and the hardware can be simplified.

As shown in FIG. 5A, the bits of the count stored in a first portion of the buffer 515 can be provided to circuitry 530 that converts the count into a bit array. For example, for 32 bit addresses, the count portion of the buffer 515 (and each record field in the RAM 500) can be five bits wide, and the bits of the count can be a binary encoding of the number of don't care (X) bits found in the least significant bit (LSB) portion of the network address. Thus, for example, if the count is the bit pattern 01000, this indicates there are eight X's, and the circuitry 530 can generate a vector mask of 11111111111111111111111110000000 0 which correspond to 24 bits we care about (indicated by the ones) and 8 bits we don't care about (indicated by the zeros). In some implementations, the circuitry 530 includes a read only memory (ROM) used to produce the vector mask. For example, in the case of 32 bit addresses, a small 32 line ROM can be employed, which is addressable by the count. In some implementations, logic is used by the circuitry 530 to generate the vector mask.

The input record can be XORed with network address data bits stored in a second portion of the buffer 515. Only a single XOR gate 525 is shown in FIG. 5A for simplicity, where a predetermined single bit from the buffer 515 is compared by the XOR gate 525 with a predetermined bit of this input record received on an input element 520. However, as indicated in FIG. 5A, there can be additional XOR gates connected with different bit positions of the second portion of the buffer 515 such that all the network address data bits can be compared with the input record in parallel (e.g., 32 XOR gates for 32 bit network addresses, and 128 XOR gates for 128 bit network addresses). In this example of some implementations, an output from the XOR gate 525 of zero indicates a match, and an output of one indicates no match.

The output of the XOR gate 525 is provided to an input of an AND gate 535. As with the XOR gate 525, only a single AND gate 535 is shown in FIG. 5A for simplicity, where a predetermined single bit from the vector mask is compared with the output of the XOR gate 525. However, as indicated in FIG. 5A, there can be additional AND gates connected with different bit positions of the vector mask such that all the bits of the mask can be compared with XOR outputs in parallel (e.g., 32 AND gates for 32 bit network addresses, and 128 AND gates for 128 bit network addresses). In this example of some implementations, an output from the AND gate 535 of zero indicates a match, and an output of one indicates no match.

The output of the AND gate 535 is provided to a NOR tree 540, which compares all of the AND gate outputs. If all of the AND gate outputs indicate a match, either because a correspond XOR gate indicates a match or because the vector mask forced a match for a specific bit, then the NOR output 545 will be one, thereby indicting a match. If any of the AND gate outputs are one, this indicates no match for that bit, and then the NOR output 545 will be zero, thereby indicating no match.

Figure 5B:
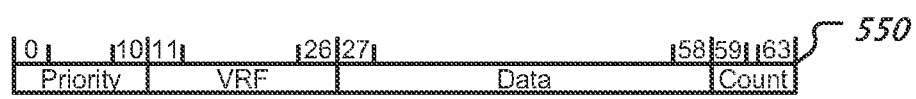
FIG. 5B shows an example of a record format for LPM and exact match implementations including virtual routing and forwarding (VRF) data.

Note that the search key can include both a network address from a received packet and also VRF data, and so the record stored in the RAM 500 can also include VRF data. FIG. 5B shows an example of a record format 550 for LPM and exact match implementations, including VRF data, stored in a 64 bit wide data RAM for use with 32 bit network addresses. This record format 550 includes 11 bits of priority (from bit index 0 to bit index 10), 16 bits of VRF (from bit index 11 to bit index 26), 32 bits of address data (from bit index 27 to bit index 58), and 5 bits of mask count (from bit index 59 to bit index 63).

In some implementations employing VRF data, it can be presumed that either all VRF data bits are X or no VRF bits are X. This information can be carried by one extra bit. Thus, the comparison circuitry from FIG. 5A can be configured to check that single extra bit to determine whether a VRF portion of the data is all don't care bits or no don't care bits. If all X, then there is a match, by definition. If all non-X, then comparison is performed as normal. Mixing LPM and VRF in the same record can be done by matching both fields and declaring a match if and only if both fields match.

One issue with adding VRF is that in many virtual networks there is a default record, all X in Internet Protocol (IP). To address this, special memory can be allocated (e.g., within a memory device 230 or a dedicated memory device 230), with no IP data, just VRF for those records. In some implementations, this saves space and frees the hash function from dealing with some of the worst scenarios, in terms of number X's records.

In addition, one less bit can be used for each record because, for example, counting from 0 to 128 takes 8 bits, but counting from 0 to 127 takes only 7 bits. Thus, as shown in FIG. 5A, only 5 bits are allocated for the mask count even though there are 32 bits of address data. Since 5 binary bits can represent the numbers (of X's) from 0 to 31, either all X's can be excluded as a possibility, or a special case can be assigned for one of the count values. For example, the count value of 31 (binary sequence 11111) can indicate all X's, and 31 X's can be excluded as a possibility.

Note that the case of all but one (the most significant) bit being don't cares is highly unlikely in network packet routing. If such a rule is received, it can be split into two rules, where the second to most significant bit (MSB) is assigned 1 in one of the rules and 0 in the other rule. Thus, in some implementations, $(2^n-1)$ is declared illegal for the count of don't care bits found in a network address, where n is the number of bits assigned to encode the count of don't care bits.

Figure 5C:
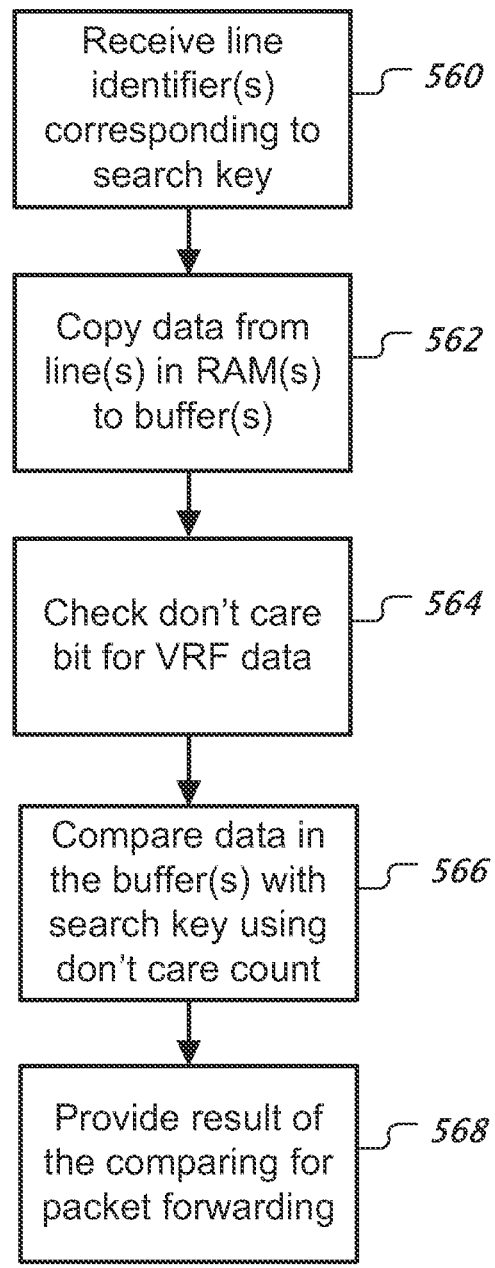
FIG. 5C is a flowchart showing an example of a process of performing LPM and exact match network processing.

FIG. 5C is a flowchart showing an example of a process of performing LPM and exact match network processing. At 560, one or more line identifiers are received, where the line identifier(s) correspond to a search key corresponding to a received packet. In general, a subset of the stored records is picked (e.g., by hashing) for comparison, thus substantially reducing the number of records to be compared with the search key. This can involve receiving identifier(s) from hash circuitry 220, such as described above. In some implementations, this involves receiving a hash value from a hash RAM.

Referring to FIG. 2, in some implementations, the hash circuitry 220 can include a hash RAM (e.g., of 8K×11), the memory devices 230 (corresponding to memory device 500 in FIG. 5A) can include 40 data RAMs (e.g., of 2K×64), and a separate priority RAM (e.g., of 32K×20) can also be included. In some implementations, the TCAM architecture described further below can be used, and the same network device can handle ACL and LPM processing for both 32 bit addresses and 128 bit addresses, as described in further detail below in connection with FIG. 5D.

Referring again to FIG. 5C, at 562, data from one or more lines in one or more RAMs are copied to one or more buffers in accordance with the line identifier(s). This can involve reading each of multiple RAMs in parallel into corresponding multiple buffers, such as described above. In some implementations, a memory device module can include multiple RAMs (such as described in further detail below), and a record can be read from every RAM in the module. Note that the search key bits need not be concatenated with the output of the hash RAM, which means that every record can have a unique hash index stored in the hash RAM. In some implementations, one large data RAM can be used with a hash RAM, and multiple records can be read from the one data RAM into multiple buffers for comparison with the search key.

At 564, a single bit value can be checked for each of the one or more buffers to determine whether a VRF portion of the data in the buffer is all don't care bits or no don't care bits. For example, if the VRF bit is one, a VRF vector that has all zeros can be generated and used during the comparing operation discussed below. Note that VRF processing can be handled in this fashion by the same network device for different size network address spaces (e.g., both IPv4 and IPv6). The same presumption can be made that either all the VRF data is don't care (X's) or none is. In addition, the same hardware and software can be designed to handle more than one size of network address space (e.g., both IPv4 and IPv6) in the same network device, where the number of bits of VRF data (e.g., 16 bits) can be the same for both network address types (e.g., 32 bit and 128 bit network addresses).

At 566, the data in the buffer(s) is compared with the search key using the encoded don't care count(s). Again, this can involve parallel comparisons performed on multiple buffers, which can correspond to multiple RAMs in a memory device module. Each count value can be loaded in each respective buffer, as described above in connection with FIG. 5A, or the count value can be read directly from the corresponding RAM for generation of a bit mask used in the comparing. As described above in connection with FIG. 5A, the network address data bits can be XORed with the search key, the bit mask can be ANDed with the resulting data, and all the bits from the AND gates (e.g., 64 bits) can be NORed together to determine if there is a match. Note that the same hardware handles LMP and exact match since a mask count of zero will cause all the data bits to be compared without any don't cares.

In addition, when VRF data is being handled, the VRF vector may be used. Note that after the ANDing, each bit of the resulting vector is either zero or one, where a zero indicates that either that bit was an X (don't care) in the original record or the XORing gave a zero to indicate the original record bit matched the search key. If the VRF bit is one, then the VRF vector can be generated as all zeros at this stage thus indicating all bits of the VRF are X's (don't cares) and so must match. Otherwise, the VRF vector can be generated by XORing the VRF bits of the record with the search key to see if the VRF bits match. Finally, the NOR can be performed on both VRF compare bits and the address compare bits to find a final match result for that record. Note that the XOR operations on the address data can be done in parallel with the data mask generation, and the VRF data XORing or VRF mask generation can be done in parallel with these as well or with the ANDing.

At 568, a result of the comparing is provided for use in forwarding of the packet by the network device. This can involve finding the last data record with a match and sending its priority, which can be part of the record. For example, records that have the highest index in the data RAM can be those with highest priority, and so multiple matches can be resolved by priority in placement.

Figure 5D:
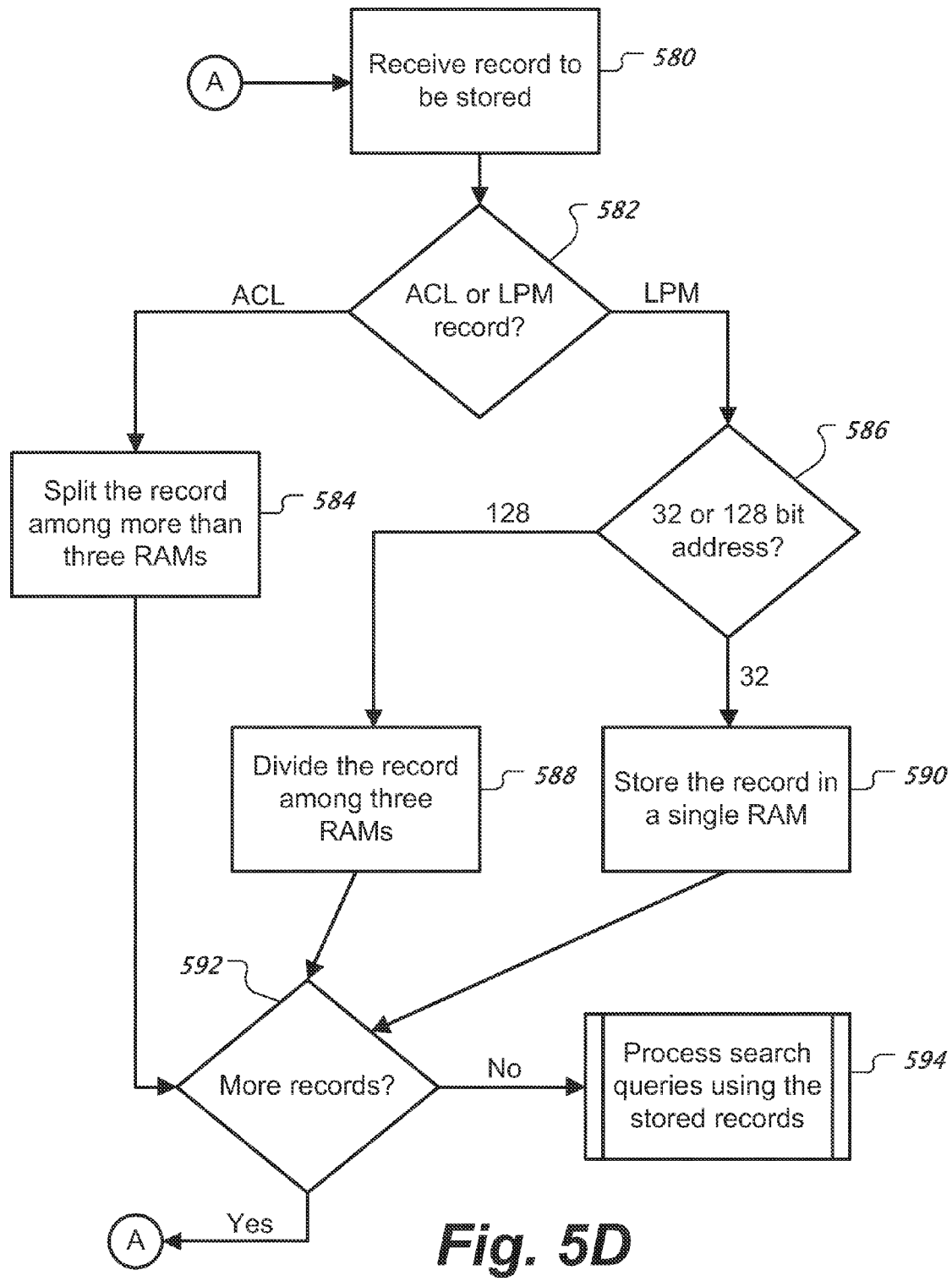
FIG. 5D is a flowchart showing an example of a process of loading records of different types.

FIG. 5D is a flowchart showing an example of a process of loading records of different types. The same hardware and software can be used handle both ACL and LPM operations. At 580, a record to be stored is received. Then, a check is made at 582 as to the type of record. When record is for ACL processing, the record can be split among more than three RAMs at 584 using the systems and techniques described herein.

When the record is for LPM processing, a check is be made at 586 as to the size of the address space. When the record includes a 128 bit address, the record can be divided among three RAMs at 588. The record can be stored logically and potentially be rearranged physically to help with the hardware. For example, in some implementations, the record can be stored as: <9 bits for the number of X in LSB> <128 bits of data> <1 bit of VRF indicating all X or no X> <16 bits of VRF>. In some implementations, each RAM can be 64 bits wide, and a first RAM can contain 58 bits[0:57]+6 mask, a second RAM can contain 58 bits[57 . . . 115]+6 masks, and a third RAM can contain 20 bits of result+12 bits[116 . . . 127]+VRF+5 mask bits.

When the record includes a 32 bit address, the record can be stored entirely in a single RAM at 590. The record can be stored logically and potentially be rearranged physically to help with the hardware. For example, in some implementations, the record can be stored as: <6 bits for number of X in LSB> <32 bits of data> <1 bit of VRF indicating all X or no X> <16 bits of VRF>. Thus, a common approach can be taken to handle LPM-32, LPM-128, and VRF data, where a code fits LPM-32+VRF+priority in a record such that three of these records can be used to code LPM-128+VRF+priority, and 64 bit wide RAMs can be employed because they are useful and cover most cases.

Once the current record is stored, a check is made at 592 for more records to store. Once all the current records have been stored, search queries can be processed at 594 using the stored records, such as described above. In some implementations, operations for 128 bit address LPM can be handled in the same manner as those of 32 bit address LPM, with the exception that every triplet is joined into one result.

Putting the records into buckets can be done by the bit packing algorithm. The all X record can fill a whole 2K×64 RAM. This can be the approach taken, or dedicated hardware can be added for an all X record, or the X-compress algorithm described above can be used. So the waste is going to be: 1) A 2K×64 for all X; 2) A 2K×64 for all VRF non X, LPM all X, probably half full; 3) hardware and/or ROM to produce the VRF mask; 4) extra 9 bits of data; 5) fix to their RAM sizes (for 48 bits there will be 64, for 128+16 bits there will be 192); and 6) hashing of about 95% full.

Thus, for example, if the received records are 64K 32 bit (IPv4) plus VRF LPM records, the device structure should include three index RAMs, one RAM for the VRF all X and IP mostly X case, one RAM for IP all X plus no X VRF case, and 32+2 RAMs for data. This results in 38 modules instead of 32 (about 20% extra) to add LPM processing to ACL processing in the device. For 128 bits of data plus 16 bits of VRF, the main waste may be fixing to 64 bit wide RAMs, and that alone may be more than 20%. Thus, when doing LPM with 128 X bits, 64 bits can be used per record, hashed by VRF and only VRF need be checked.

For LPM with less than 128 X bits, 7+1 extra bits can be used because the number of X's is between 0 and 127. The data can be segmented to 128 bits of LPM, 16 bits of VRF, and 8 bits of extra. In other words, four (64 bit wide) RAMs can be read by a given index, two for LPM, one for VRF, and one for the extra. The hash value can be used as index for the data, the MSB-2 can be used for VRF, with the last two choices being which of the 64 bits are used as VRF, and the extra can be read according to MSB-3, with the last three choosing the extra 8 bits of 64 bits. Thus, for 64K of records, 68 RAMs can be used for LPM, 9 RAMs can be used for VRF, 2 RAMs can be used for extra, and 3 RAMs can be used for 128X. Altogether, this is 82 RAMs. Note that for both cases fullness is increased with number of records.

Once all the records are loaded (e.g., upon boot up) and the device is online, updates can also be made. Insertion can be made straight forward by using last in to indicate highest priority. But deletion is more challenging since all values are legal. For the 32+16 case, the extra bits available in each RAM can be used to indicate whether respective records are valid. For 128 bit address, there are various ways to handle deletion. One approach is to declare that 127 X and all X VRF is illegal, and if need, just split the record into two records with 126 X each; if all the extra are 1, the record is deleted. A second approach is to have a shift of records when a record is deleted; the shift should happen in LPM, VRF and extra RAMs at the same time. A third approach is to add bits to the RAMs.

Figure 6A:
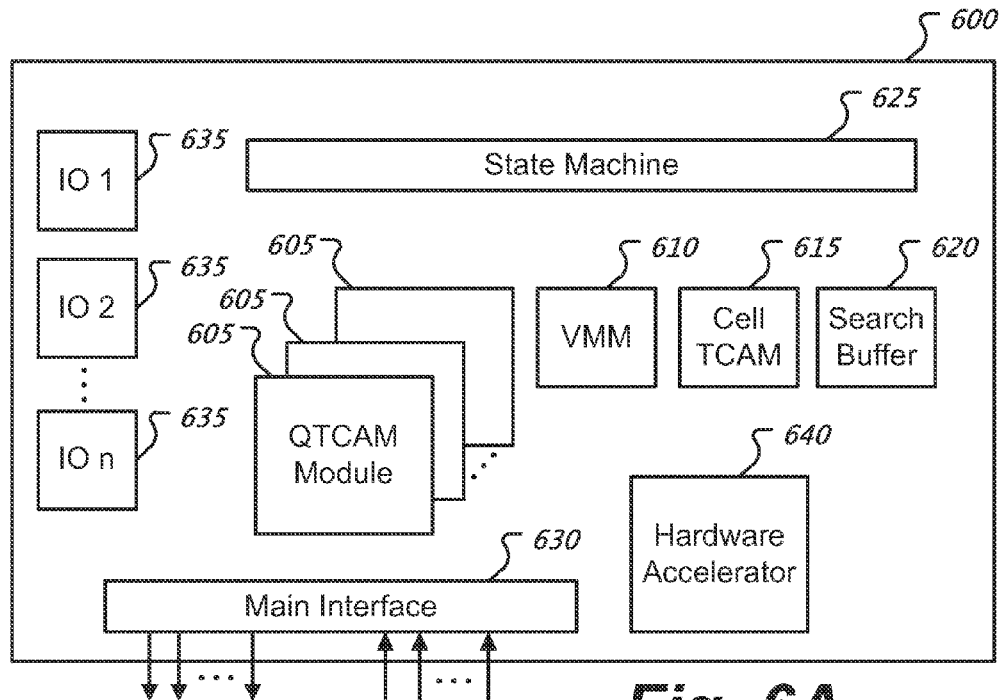
FIG. 6A shows an example of a network device architecture to support TCAM processing.

FIG. 6A shows an example of a network device architecture to support TCAM processing, which can be implemented as a network search engine (e.g., network search engine 140 in FIG. 1) that effects one or more of the systems and techniques described above. A network device 600 can include multiple QTCAM modules 605, a virtual memory manager (VMM) 610, a cell based TCAM 615, and a search buffer 620. The network device 600 can also include a state machine 625 to facilitate control of operations within the network device 600, a main interface 630 to receive search keys or strings and output results, and additional input/output (IO) interfaces 635 to support testing or other operations.

The main interface 630 can be a serializer/deserializer (SERDES) interface with multiple receiver (RX) lines and multiple transmitter (TX) line, e.g., a 12.5 GBPS SERDES with 24 RX and 12 TX lines. The 10 interfaces can include a JTAG (Joint Test Action Group) interface, an I2C (Inter-Integrated Circuit) interface, and one or more other IO interfaces. In addition, the network device 600 can include a hardware accelerator 640, which is described in further detail below.

The search buffer 620 can be included to maintain old searches. The size of the search buffer 620 can be varied with the requirements of a given implementation. For example, the search buffer 620 can be a RAM having a size of between 8K×80 and 16K×80. In some implementations, this RAM can be allocated from a central pool of RAMs available for scratch pad.

In some implementations, all searches initiate from the search buffer 620. The search protocol can work as follows: 1) search string is sent in the search buffer and search identifier (ID) is returned; 2) upon successful receipt of the search ID, a search can be initiated using the search ID; and 3) in case of buffering and simultaneous searching, the search ID can be returned but there may be no need to initiate the explicit request for search. For example, this is indicated by the following pseudo code:

searchID=$search_buf(0/1,"SEARCH STRING"); //0 indicates immediate//search start whereas 1 means only save the search string in the buffer $startSearch (searchID);

Thus, this can provide flexibility for both the loading and use of searches, and also for the reuse of searches, thereby reducing the amount of data that needs to be sent over the main interface 630.

Figure 6B:
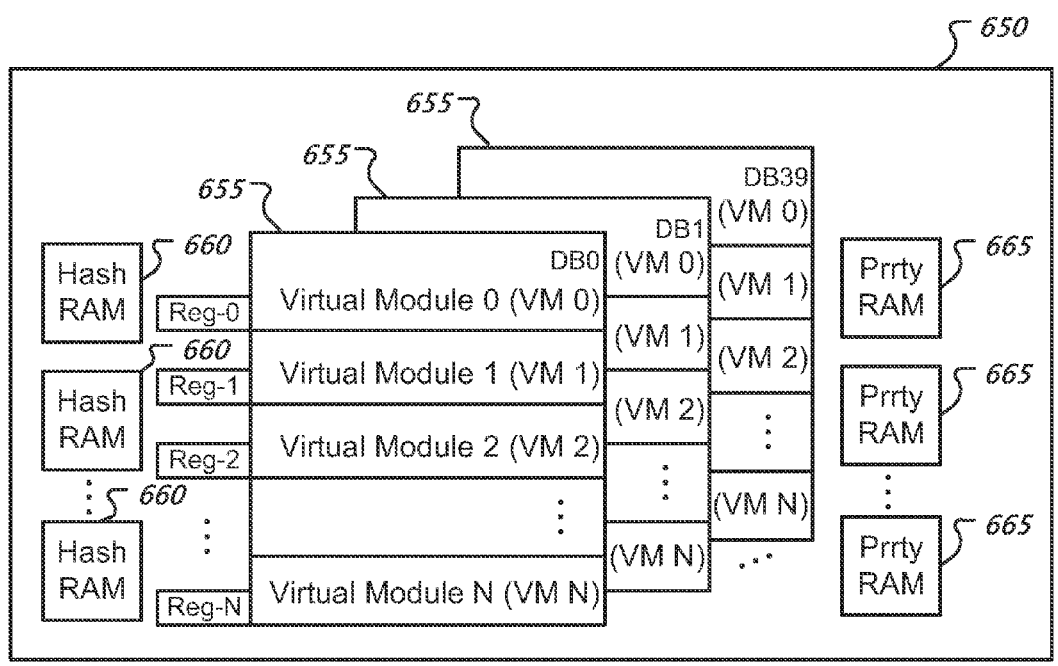
FIG. 6B shows an example of a memory device module useable in the network device architecture of FIG. 6A.

FIG. 6B shows an example of a memory device module 650 useable in the network device architecture of FIG. 6A, e.g., each QTCAM module 605 can include the components of the memory device module 650. The memory device module 650 can include multiple (e.g., forty) database (DB) RAMs 655, multiple (e.g., N=four or more) hash RAMs 660, and multiple (e.g., N=four or more) priority (prrty) RAMs 665. N is the number of virtual modules in a given module 650. If there are four virtual modules in a module 650, then there will be four registers (Reg-0, Reg-1, Reg-2, and Reg-N) that define the boundaries of these virtual modules. These registers can be included within the memory device module 650 (as shown) or be located elsewhere, e.g., in the VMM 610. In any case, the registers are associated with DB RAMs 655 of the memory device module 650, either through hardware, software, or both.

The VMM 610 can be configured to define multiple tables of different bit widths and different record depths within the multiple memory modules. In some implementations, each virtual module can be configured for 80/160/320/640 bits. For example, if each DB RAM 655 in each of the QTCAM modules 605 is an 80 bit wide RAM, then tables of 80 bit width, 160 bit width, 320 bit width, or 640 bit width can be set up within the network device 600. In a stacked mode configuration, only a single module 605 is sufficient for handling any of these sizes, with the throughput cut in half for 80 bit multiples from 80 to 640 bits. In some implementations using stacked mode, virtual modules are not required, as it can be sufficient to assign each module and its width. However, in stacked mode, the throughput will be halved for 160 bit compared to 80 bit, and will similarly be halved for 320 bit from 160 bit.

Figure 6C:
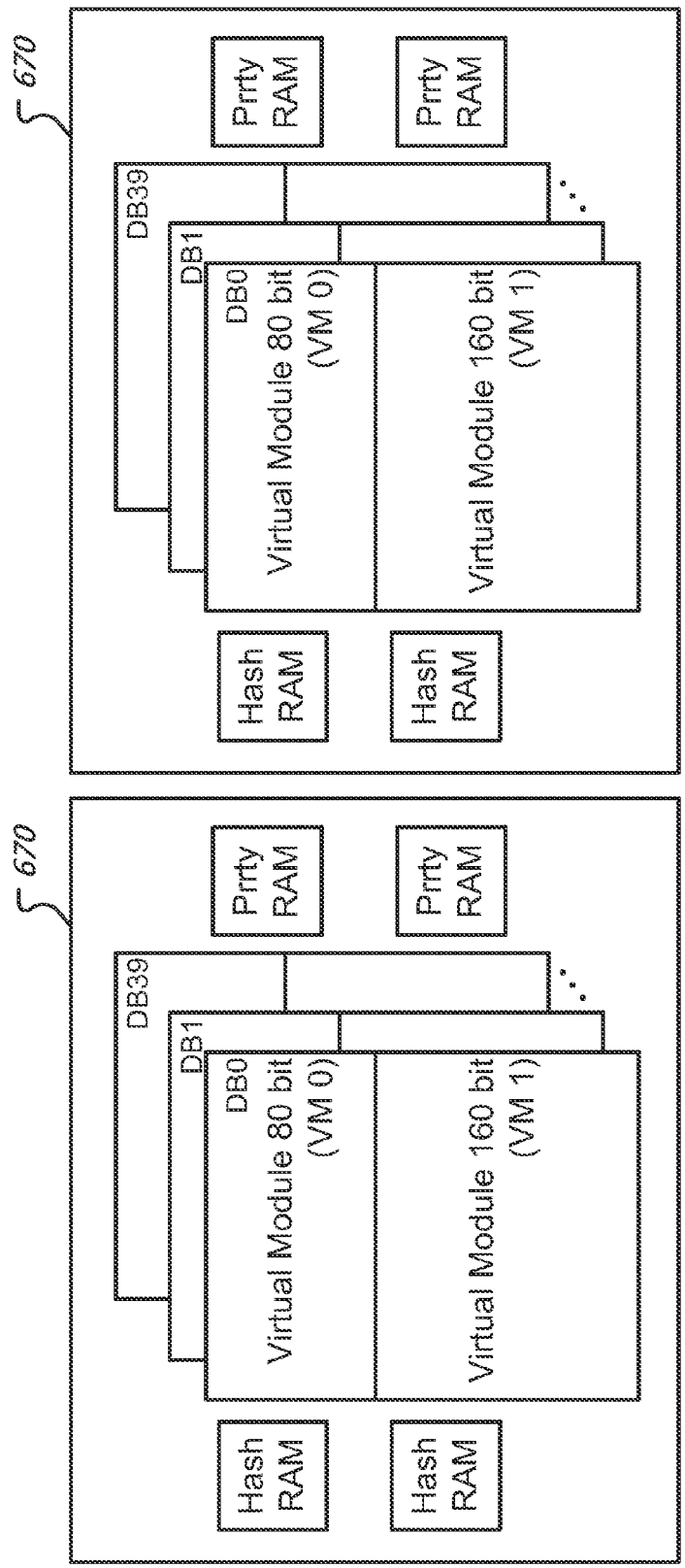
FIG. 6C shows an example of memory device modules configured to support 80 bit and 160 bit virtual modules in parallel mode.

If the modules 605 are configured for parallel mode, then multiple modules are required, i.e., two modules for 160 bits, four modules for 320 bits, and eight modules for 640 bits. For example, in an implementation using two QTCAM modules 670, as shown in FIG. 6C, where the modules are configured to support 80 bit and 160 bit in parallel mode, then a single register can be used to configure the boundaries by knowing the number of entries in 160 bit virtual module. The rest will all be an 80 bit virtual module. At the time of search, the address generated by the respective hash RAM is offset by the boundary register value.

In some implementations, this virtual module configuration capability is implemented completely in hardware, such that the software (e.g., the software running on the processor 180 in FIG. 1, which makes requests to set up tables for rules and requests to search the tables for rules) remains completely oblivious to the details of the implementation. The software assumes that there are two modules of 80 bit width and 160 bit width, without realizing that the actual RAMs are all 80 bits wide.

Figure 6D:
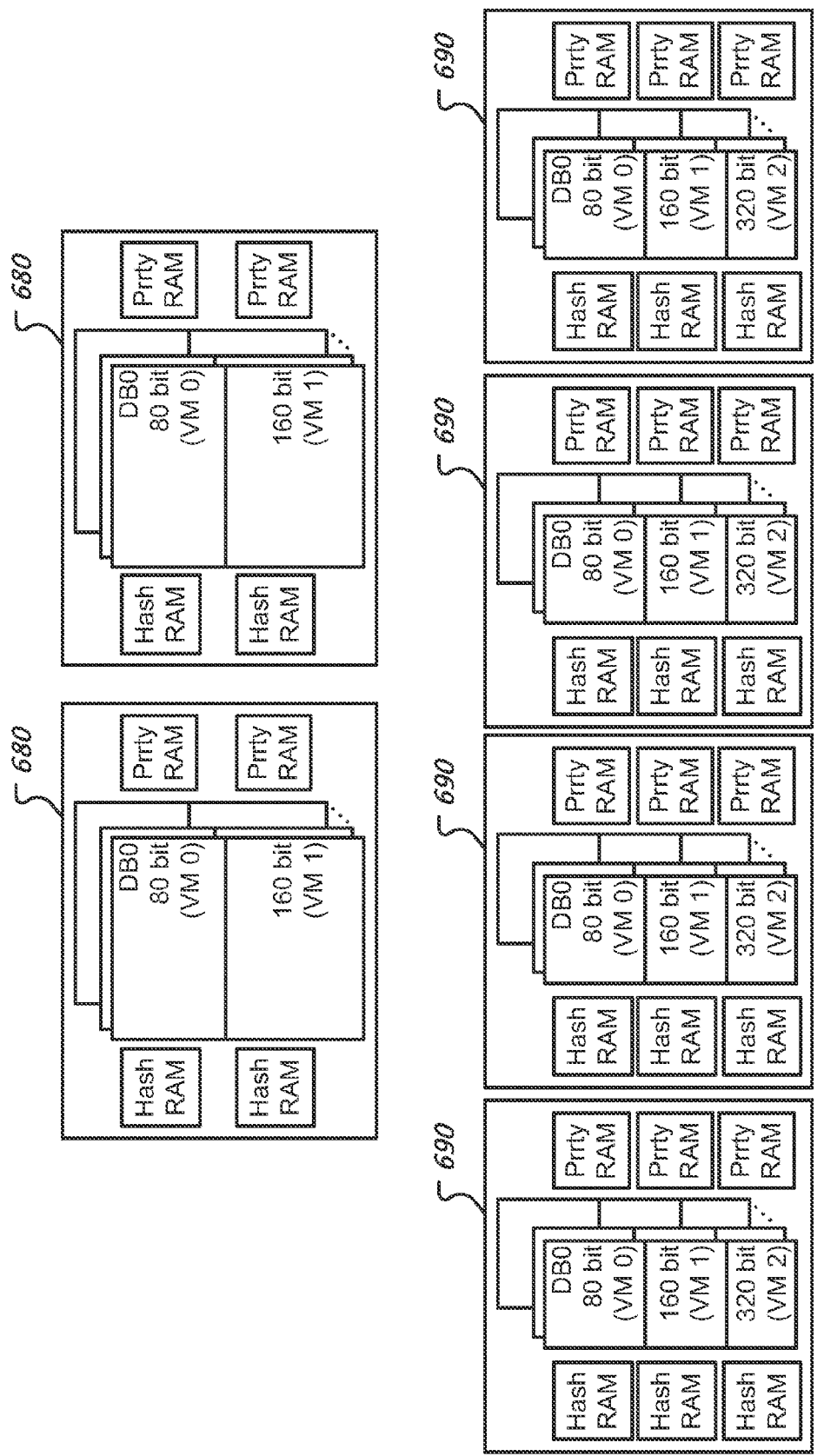
FIG. 6D shows an example of memory device modules configured to support 80 bit, 160 bit and 320 bit virtual modules in parallel mode.

Similarly, if the device is configured for 80/160/320 in parallel mode, then at least four QTAM modules are used. FIG. 6D shows an example of memory device modules 680 and 690 configured to support 80 bit, 160 bit and 320 bit virtual modules in parallel mode. In this case, six modules are used, where four of the modules are configured for 320 bits by setting the boundaries of the four modules using the registers, the 160 bit virtual modules are likewise configured, and the rest of the space can be configured for 80 bits.

In some implementations employing parallel mode, two modules are needed for 160 bit, four modules are needed for 320 bit, and eight modules are needed for 640 bit. The use of virtual modules can prevent the waste of memory space, such as would be the case in the event of a request to store only a few 640 bit entries, where the lack of virtual modules as described herein could result in most of the memory modules being empty. Thus, the use of virtual modules allows optimal utilization of the space in the memory devices of the CAM (e.g., a TCAM as described in detail above). In addition, there can be advantages in power consumption using this architecture.

This architecture enables wide flexibility in how memory space is divided up to handle tables of different widths and different depths. For example, the memory modules 650 can also be configured for 160 bit parallel mode, where the hardware allocates two modules 650 for running 160 bit searches completely, i.e., all the virtual mode registers for the demarcation of sizes are set such that all of the allocated two modules are allocated for 160 bit rules. From the software point of view, it will then be assumed that the hash RAMs of the two modules have the same content with eighty DB RAMs (forty RAMs from one of the modules plus forty RAMs from the other module). The priority RAMs are also assumed to have the same values.

Referring to FIGS. 6A & 6B, the VMM 610 spreads a database in the multiple modules such that it can be searched at one given time. For example, the database can be spread across 40 modules in a 100 Mbit TCAM with 2.5 Mbit module size. This will give 40 results. In normal operation, the results can be passed through a priority encoder to give a single result, but in some cases (when more than one result is desired) the results can be passes through the VMM 610, which controls the priority encoder granularity and can produce multiple results based on its configuration registers.

In addition, the VMM 610 can be built to have the capability to turn off memory modules, as desired. For example, if 285 tables of small sizes (e.g., 4K×80, 2K×160, . . . ) are requested, then the VMM 610 can turn off the other modules that are not needed for this search engine configuration. This can result in significant power savings.

In some implementations, a granularity up to 4K×80, 2K×160, 1K×320 or 512×640 entries per table should be supported. This is approximately 360 Kb entries. If the total TCAM size is 100 Mbit, then it is expected to support:

$$\text{Number of tables} = \text{Total } TCAM \text{ Size/Least Granularity}$$
$$= 100 \text{ Mb}/360 \text{ Kbit} = 285 \text{ tables.}$$

If each $QTCAM$ module 605 can handle 2.5 Mbit of $TCAM$ entries($RAM$ size time $40/2 = 2K \times 64$ times $40/2$) then a total of 20 modules in $QTCAM$ can be used:

$$\text{Number of modules} = \text{Size of } TCAM/\text{Size of Module}$$
$$= 100 \text{ Mbit}/2.5 \text{ Mbit}$$
$$= 40 \text{ Modules.}$$

Each module can be configured into N number of virtual modules. Therefore total number of Virtual modules required in this case are:

$$\text{Number of Virtual Modules} = \text{Number of tables/Number of Modules}$$
$$= 285/40$$
$$= 7 \text{ Virtual modules.}$$

However, since this QTCAM architecture searches in one virtual module in a given module 605 in one cycle, the VMM 610 can be used to manage these searches in tables.

In addition, although most of the architecture design relates to the QTCAM modules 605, the cell based TCAM 615 can be added to realize further benefits. When rules are loaded into the network device 600, there may be corner cases that could result in a drop in the fill rate or utilization of the QTCAM modules 605. In order to avoid such situations, a small cell based TCAM 615 can be added to the architecture. Based on the worst case pragmatic dataset, the ratio between the QTCAM 605 and the cell based TCAM 615 can be selected to increase the overall fill rate. For example, the QTCAM size can be 98 Mbit, and the cell based TCAM size can be 2 Mbit (98% to 2%, a ratio of 49 to 1), where the cell based TCAM 615 can handle 25K rules of 80 bit, 12K rules of 160 bit, and so on.

In some implementations, latent and/or spare QTCAM modules 605 can also be included. QTCAM fill rate can drop significantly in the last two modules in some implementations. For example, the last module may normally be 50% full, whereas the second to last module may normally be 75% full. Therefore, including more and smaller modules may be preferred. Likewise, smaller memories can be used, which in turn gives smaller modules and therefore more flexibility.

One or more latent (or hidden) QTCAM modules 605 can be added to realize performance improvements. One extra module would often be enough in many implementations. However, including two extra modules can also significantly improve the fill rate and utilization in some implementations.

QTCAM latent modules can be used as spare modules. During the online algorithm (when the network device is up and running), the fill rate is low compared to the offline algorithm (during initial boot up and loading of the network device with rules). The purpose of the spare modules is to re-hash the modules from time to time to improve the fill rate. This allows improvements in the capacity and fill rate without impacting search rate. Upon the successful re-hashing of a given module it can be automatically deactivated, and the spare module can then assume the role of that module. Note that this use of latent and spare modules can be performed in conjunction with the operations of the hardware accelerator 640.

Figure 7A:
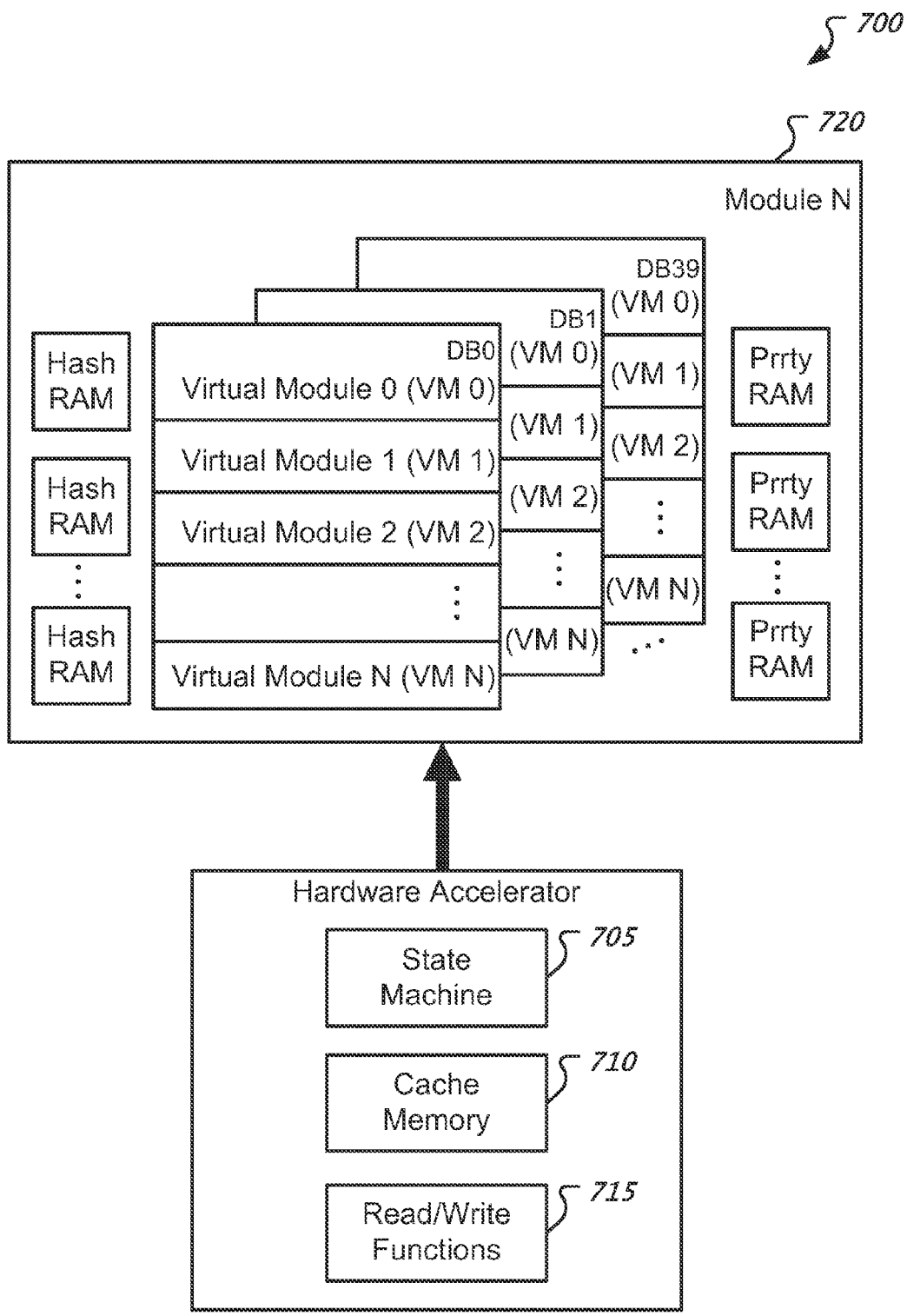
FIG. 7A shows an example of a hardware accelerator system.

FIG. 7A shows an example of a hardware accelerator system 700, which can be added to the architecture in some implementations because: (1) the selection of a dynamic hash function may be suboptimal in the online algorithm due to limitations on advance knowledge of future records, and (2) update performance can be slowed down due to the processing power of the control plane processor (e.g., processor 180 in FIG. 1). The hardware accelerator (HWA) system 700 can be used for optimization in both of these situations.

A state machine 705 can perform the QTCAM algorithm on a single module. A cache memory 710 can be included, which is big enough to hold and process the QTCAM entries of a module. Read/write functions 715 can read the actual module into the cache memory 710 for processing. In addition, a dedicated memory module 720 can be included and swapped with the actual module upon the completion of the re-hashing.

The protocol between the control plane software and the HWA can be defined in various ways. Functions that can read the actual modules can readily read the contents of the database RAM by simply reading the rows of all the bin memories. For example the procedure can be as follows: 1) the software provides the bin number and modules number of the database memories; and 2) the software provides the priority of the entries in the bin. The following pseudo code provides an example of how this can work:

$rehash(ID0, Bin0, Module0); $rehash_prioirity(ID0, Pr0, Pr1, ..., Pr63);
$rehash(ID1, Bin3, Module1); $rehash_priority(ID1, Pr0, Pr1, ..., Pr63);
$rehash(ID2, Bin2, Module5); $rehash_priority(ID2, Pr0, Pr1, ..., Pr63);
$rehash(ID3, Bin1, Module2); $rehash_priority(ID3, Pr0, Pr1, ..., Pr63);
hashBits[0-13]=$rehash_start(Module10, ID0, ID1, ID2, ID3);

In the above commands, software is describing the bins of the modules to be read into the HWA cache memory 710 with the associated priorities. Upon the completion of the read process it asks for the optimal hash function generation.

The HWA performs the rehashing of the different bins of the modules as described in the $rehash command and populates the results in Module 10, as requested by the $rehash_start command. In order to synchronize the control plane shadow RAM and the modules, the HWA returns the hash bits back to the control plane. Note that the $rehash_start command can only take the rehashing job as big as its cache buffer, which will likely be equal to the size of a given module.

Various elements can be added to the HWA system 700 in various implementations. For the following discussion of these options, it will be assumed that the module size is 16K records, there is no DRAM interface, and an ARM processor and about 5 MByte of L2 memory is used. However, different implementations can employ different amount of processing power, cache memory, etc. In general, more hardware acceleration capabilities and features will be appropriate if justified by the particular application of the architecture described herein.

Including a read module in the HWA system 700 can be very helpful. The basic software data structure can be a buffer of records, with 2 bits per TCAM bit. The values of the bits can be: 00=0; 01=1; 10=X; and 11=delete record, illegal, ignore. A record can be represented by a structure of {
int data[RECORD_SIZE/16];
int priority; //a smaller field is enough, but software will be harder
}

Note that the number of bytes per record depends on the record size.

When two TCAM bits are written in 4 lines, we have 4 bits with the following values:

| MSB | LSB |
|-----|-----|
| 0 | 0 --> 0111 |
| 0 | 1 --> 1011 |
| 0 | X --> 0011 |
| 1 | 0 --> 1101 |
| 1 | 1 --> 1110 |
| 1 | X --> 1100 |
| X | 0 --> 0101 |
| X | 1 --> 1010 |
| X | X --> 0000 |

A deleted record is marked by 1111 in data RAM 0. Note that this 1-to-1 mapping can be reversed.

In other words, by reading the module data RAMs the records can be reconstructed. The read module can operate according to the following pseudo code:

```
Read input hash bits.
For (i=start_virtual_partition; i<end_virtual_partition; ++i)
   for (j=0; j<RECORD_SIZE; ++j)
   {
      read from ram j line 4*i into reg0
      read from ram j line 4*i+1 into reg1
      read from ram j line 4*i+2 into reg2
      read from ram j line 4*i+3 into reg3
      for (k=0; k<32; ++k)
      {
         calculate record 32*i+k, bits 2*j, 2*j+1m based on
            reg0[k], reg1[k], reg2[k], reg3[k]
      }
   }
   read priorities[32*i..32*i+31]into the priority field of the record.
   Set the 32 records, and 32 priorities, in an array. If a record is
   deleted then either eliminate it by having a shorter array or set
      its priority to NOT_FOUND.
   Calculate the hash value of every record by assuming that X is 0.
      (It means that we calculate one, and only one, hash value per
   record.)
   If hash[hash_value!=i) eliminate the record or set priority to
   NOT_FOUND.
   }
   As an optional operation, after "all done", get rid of the NOT_
   FOUND records.
```

Regardless of whether or not a read module is included, the HWA system 700 should have a statistic set of records. For example, the HWA system 700 can operate in accordance with the following pseudo code:

```
Input: A buffer of records in the form of <record><prio>
   A list of hash bits.
   An index bit for stat.
   An address of a buffer for count the size of (2**hash_bits)*3.
      Software will zero that buffer.
   An address of a buffer for hash values, size (2**hash_bits).
      // as a working area for the hardware (hw)
   loop over all records:
   {
```

```
   if record is not eliminated then:
   1) Calculate all hash values (x in hash bits means multi values)
and save in buffer.
   2) Find v=value of bit index.
   loop over all hash values
   {
      ++count(3*hash+v);
   }
}
```

Furthermore, additional functions can be included, such as shown in the following pseudo code:

```
1) Loop over all bits.
Change the parameters to:
Input: A buffer of records in the form of <record><prio>
   A list of hash bits.
   Record size.
   An address of a buffer the size of (2**hash_bits)*3.
      Software will zero that buffer.
   An address of a buffer for hash values, size (2**hash_bits).
loop over all bits, as above.
After you have the stat for a bit calculate "badness" as:
//Loop over all triples 1count[0], count[1],count[2]}, {count[3],
count[4], count[5]}...
//for every triple, the first number is 0, second is 1, third is X.
If the sum of all of them
//is 32 we have no problem, they fit in one line regardless
of other issues
best = very large number
for j=0; j<RECORD_SIZE; ++j)
   if j is a hash bit, continue;
   1) Calculate statistics for bit j as before.
   2)
   bad=0
   for (i=0; i<(2**hash_bits); i=i+3)
   {
      if (count[3*i+2]>0)
      { // has X
         s=count[3*i] + count[3*i+1] + count[3*i+2];
         if (s<32) ++bad;
         if (s<=32) continue; // perfect for bucket.
      }
      bad=bad+max(count[3*i], count[3*i+1])+2*count[3*i+2];
   }
   if (bad<best)
   {
      bad=best; best_bit=j;
   }
}
3) Return j;
```

Finally, the following additional features can be added to the HWA system 700. The priority can be set as 32 bits. If it is negative, ignore the record; instead of copying, just set the MSB of the priority. A write line can be provided to supply 32 records and an index. The hw can calculate the 4 lines to the data RAMs, write them, and write the priorities. If priority is NOT_FOUND, delete the record by writing all 1 in bit 0.

Figure 7B:
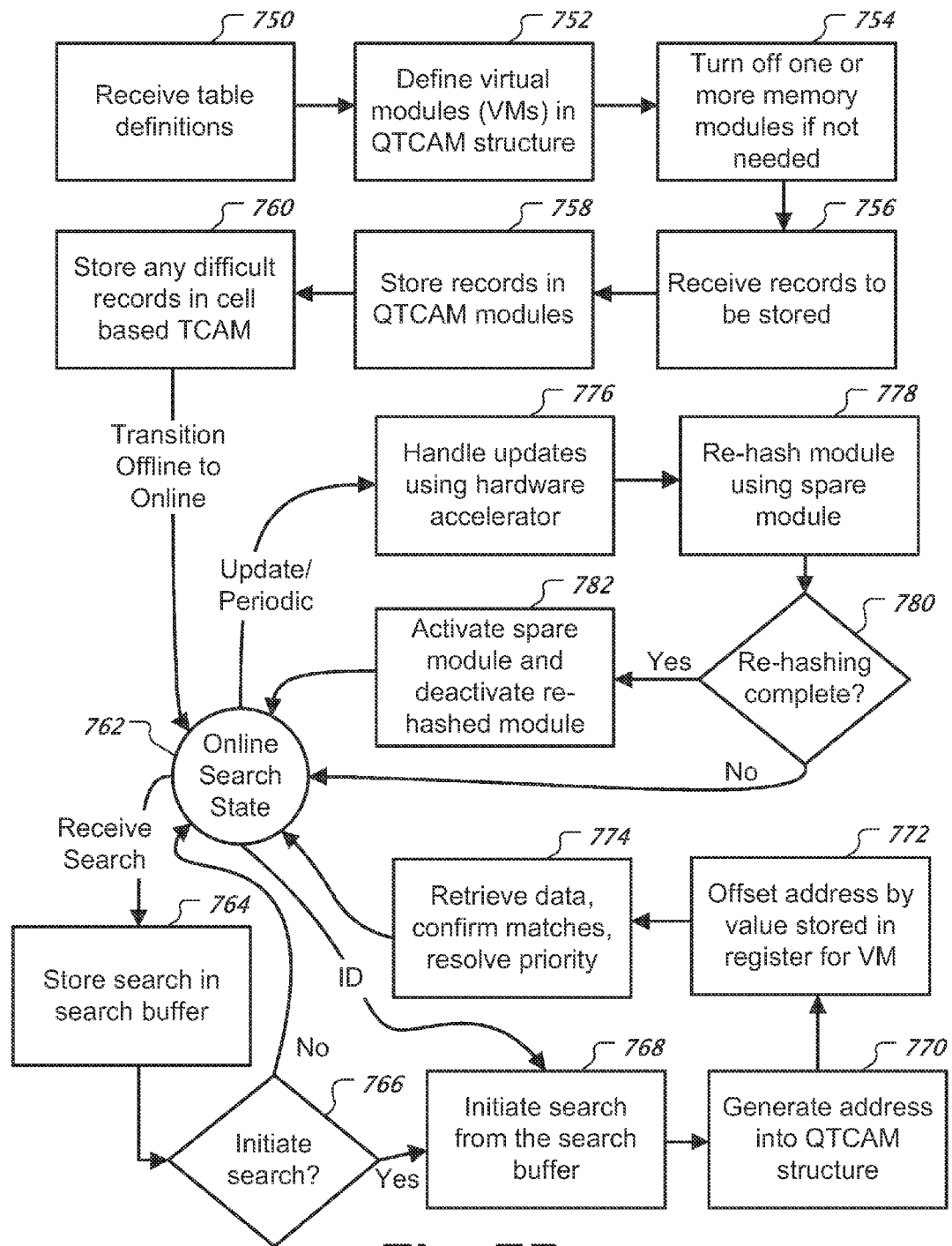
FIG. 7B is a flowchart showing an example of a process of loading and searching records using a network search engine architecture in accordance with FIGS. 6A-7A.

FIG. 7B is a flowchart showing an example of a process of loading and searching records using a network search engine architecture in accordance with FIGS. 6A-7A. At 750, table definitions are received, e.g., from an external software module that uses the network search engine. At 752, virtual modules (VMs) are defined in a QTCAM structure (such as describe above) in accordance with the table definitions. At 754, one or more memory modules can be turned off if they are not needed based on the current set of table definitions.

At 756, records are received to be stored in the network search engine. At 758, most (if not all) of the received records are stored in the QTCAM modules. At 760, if some of the received rules would cause fill rate or utilization issues in the QTCAM modules, i.e., due to the nature of the patterns in the rules and the algorithmic techniques used to place rules in the QTCAM structure, these rules can be stored in the cell based TCAM. Note that the process from 750-760 need not be explicitly sequential, as shown, but will typically take place during a boot up, or offline state. Once all the initial rules are loaded, the network search engine transitions to an online search state 762.

When a search is received, the search is stored at 764 in the search buffer. The received search indicates whether or not to immediately issue the search, which is determined at 766. If not, a search ID is provided as the network search engine returns to the search state 762. This search ID can then be used to initiate the previously loaded search at a later time. If the search is immediately initiated upon loading of the search, the search is immediately initiated at 768 from the search buffer before providing the search ID.

The search involves generating an address into the QTCAM structure at 770. This can involve performing hash operations, as addressed above. Note that the cell based TCAM can also be searched in parallel. At 772, the generated address is offset by a value stored in a register for the VM being searched. At 774, the data is retrieved based on the offset address, any matches are confirmed, and priority among any such matches are resolved.

When rule updates are received during online search operations, the hardware accelerator can be used at 776 to handle such updates. At 778, a memory module that is in use can be re-hashed using a spare memory module. Note that such updates and/or re-hashing can be triggered periodically as well. When successful re-hashing of the memory module is detected at 780, the spare memory module can be activated and the re-hashed memory module can be deactivated at 782. Note that "not so good" hash functions can be readily found, such as by running stat on the records in the TCAM. Direct hashing can be done until space runs low, and then an offline algorithm can be run with all records in not-so-full modules. If this results better packing of data, then this is all that is needed, and if it doesn't, then more virtual memory modules can be allocated until there are enough records to run the offline algorithm better.

In addition, it should be noted that one issue with traditional TCAM is that it is typically organized in fixed size records. The record size is set when the chip was designed, but a customer may need different, dynamic sizes for different tables. This can be addressed using bit masking. Bit masking is the ability to mask some of the TCAM bits to don't care before a search is conducted. This masking can be to a fixed size block or to a variable size block (e.g., using the QTCAM architecture described above).

One approach to embed smaller size records (e.g., 32 bits wide tables in 80 bits wide TCAM) is to just mask the unused bits (e.g., 48 bits in the example above). Another table can then be stored in the unused bits. The caller for the TCAM will then remember the location of a block of DRAM associated with the table and add that to the TCAM result before accessing the DRAM. This addition can either be done inside the chip or outside the chip using a similar techniques, namely, associate the add factor, per channel, with the profile definition and adding it to the search result. This technique can be used in both traditional TCAM and architectures and the QTCAM architecture described above.

In the case of the QTCAM architecture, vertical splicing can be employed. Different bits can be masked for different, horizontally spliced, virtual memory modules. In such cases, the priority RAM can be used to give a different priority to different splices of the same physical record, according to the profile of the search.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A network device comprising:
    a content addressable memory (CAM) device comprising random access memory (RAM) devices; and
    a register configured to store a value for the RAM devices of the CAM device;
    wherein the CAM device is configured to retrieve data stored in the RAM devices of the CAM device, at a received address offset by the value stored in the register, for comparison to at least a portion of a search string received from a network processor to handle network packet processing.

2. The network device of claim 1, wherein:
    the CAM device comprises multiple memory modules, wherein each of the multiple memory modules comprises multiple RAM devices having multiple associated registers configured to define boundaries of multiple virtual modules within each of the multiple memory modules; and
    the network device further comprises a virtual memory module manager configured to define multiple tables of different bit widths and different record depths within the multiple memory modules.

3. The network device of claim 2, wherein the CAM device comprises an algorithmic ternary CAM (TCAM) formed using the multiple memory modules, and wherein the CAM device further comprising a cell based TCAM.

4. The network device of claim 3, wherein a ratio between a size of the algorithmic TCAM and a size of the cell based TCAM is selected to increase an overall fill rate.

5. The network device of claim 2, wherein the virtual memory module manager is configured to turn off one or more memory modules that are not needed based on a current set of table definitions.

6. The network device of claim 2, further comprising a spare memory module for use in re-hashing of the multiple memory modules.

7. The network device of claim 2, further comprising a hardware accelerator configured to facilitate updates to the multiple memory modules during online operation, after an initial loading of rules during boot up of the network device.

8. The network device of claim 2, further comprising a search buffer.

9. The network device of claim 8, further comprising a serializer/deserializer (SERDES) interface.

10. The network device of claim 1, wherein the register comprises four or more registers configured to store four or more values to define boundaries of four or more virtual modules that span the RAM devices in the CAM device.

11. The network device of claim 10, wherein the CAM device comprises a ternary CAM (TCAM) device.

12. A method comprising:
    receiving, in a content addressable memory (CAM) device, an address to access random access memory (RAM) devices of the CAM device;
    offsetting the address by a value stored in a register associated with the RAM devices of the CAM device; and
    retrieving data stored in the RAM devices of the CAM device at the offset address for comparison to at least a portion of a search string received from a network processor to handle network packet processing.

13. The method of claim 12, wherein receiving the address comprises receiving the address from a hash RAM, and offsetting the address comprises offsetting the address by a value stored in a register selected from a set of four or more registers corresponding to four or more virtual modules that span the RAM devices in the CAM device.

14. The method of claim 12, wherein:
the CAM device comprises multiple memory modules, wherein each of the multiple memory modules comprises multiple RAM devices having multiple associated registers configured to define boundaries of multiple virtual modules within each of the multiple memory modules; and
the method further comprises defining multiple tables of different bit widths and different record depths within the multiple memory modules.

15. The method of claim 14, wherein:
the CAM device comprises
  (i) an algorithmic ternary CAM (TCAM) formed using the multiple memory modules, and
  (ii) a cell based TCAM; and
the method further comprises using the cell based TCAM to store rules that would drop a fill rate or utilization if placed in the algorithmic TCAM.

16. The method of claim 14, further comprising turning off one or more memory modules that are not needed based on a current set of table definitions.

17. The method of claim 14, further comprising:
re-hashing a module of the multiple memory modules using a spare memory module; and
upon successful re-hashing of the module, activating the spare memory module and deactivating the re-hashed memory module.

18. The method of claim 14, further comprising using a hardware accelerator to handle updates to the multiple memory modules during online operation, after an initial loading of rules during boot up.

19. The method of claim 18, further comprising initiating all searches of the CAM device from a search buffer.

20. The method of claim 19, wherein the initiating comprises initiating a search in response to a same command that loads the search into the search buffer.

* * * * *